United States Patent
Yanagisawa

(10) Patent No.: US 9,355,859 B2
(45) Date of Patent: May 31, 2016

(54) STACKED CHIPS WITH THROUGH ELECTRODES

(71) Applicant: ROHM CO., LTD., Kyoto (JP)

(72) Inventor: Azusa Yanagisawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/541,537

(22) Filed: Nov. 14, 2014

(65) Prior Publication Data

US 2015/0137358 A1    May 21, 2015

(30) Foreign Application Priority Data

Nov. 20, 2013   (JP) .................................. 2013-240096

(51) Int. Cl.
*H01L 23/48*   (2006.01)
*H01L 21/44*   (2006.01)
(Continued)

(52) U.S. Cl.
CPC ........ *H01L 21/308* (2013.01); *H01L 21/76898* (2013.01); *H01L 21/78* (2013.01); *H01L 23/481* (2013.01); *H01L 23/544* (2013.01); *H01L 24/80* (2013.01); *H01L 24/92* (2013.01); *H01L 24/94* (2013.01); *H01L 25/0657* (2013.01); *H01L 25/0756* (2013.01); *H01L 24/11* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 2223/5446* (2013.01); *H01L 2223/54426* (2013.01); *H01L 2223/54453* (2013.01); *H01L 2224/08147* (2013.01); *H01L 2224/1148* (2013.01); *H01L 2224/13014* (2013.01); *H01L 2224/13023* (2013.01); *H01L 2224/13025* (2013.01); *H01L 2224/13111* (2013.01); *H01L 2224/13147* (2013.01); *H01L 2224/14181* (2013.01); *H01L 2224/16145* (2013.01); *H01L 2224/17181* (2013.01); *H01L 2224/2919* (2013.01); *H01L 2224/33181* (2013.01); *H01L 2224/73104* (2013.01); *H01L 2224/73204* (2013.01); *H01L 2224/80895* (2013.01); *H01L 2224/80896* (2013.01);
(Continued)

(58) Field of Classification Search
CPC ............ H01L 25/0756; H01L 25/0657; H01L 23/481; H01L 23/544
See application file for complete search history.

(56) References Cited

U.S. PATENT DOCUMENTS 6,617,669 B2 *   9/2003   Saito ...................... G03F 9/7084
                                                                    257/622
7,288,461 B2 *  10/2007   Chia ....................... G03F 9/7076
                                                                    257/E23.179
(Continued)

FOREIGN PATENT DOCUMENTS

JP       2011-071441 A      4/2011

*Primary Examiner* — Alonzo Chambliss
(74) *Attorney, Agent, or Firm* — Rabin & Berdo, P.C.

(57) ABSTRACT

A semiconductor device according to the present invention includes: a combination object; and a chip having a front surface opposed to a front surface of the combination object. The chip includes: a multi-level wiring structure provided in the front surface of the chip; a connection electrode provided in the multi-level wiring structure and electrically connected to the combination object; an alignment mark set provided in the multi-level wiring structure and electrically isolated from the connection electrode; and an electrically conductive film provided at a higher level than the alignment mark set in association with the multi-level wiring structure to cover the alignment mark set and electrically isolated from the connection electrode.

7 Claims, 29 Drawing Sheets

(51) Int. Cl.
*H01L 21/308* (2006.01)
*H01L 23/544* (2006.01)
*H01L 21/78* (2006.01)
*H01L 21/768* (2006.01)
*H01L 25/075* (2006.01)
*H01L 25/065* (2006.01)
*H01L 23/00* (2006.01)

(52) U.S. Cl.
CPC ............. *H01L 2224/8113* (2013.01); *H01L 2224/81129* (2013.01); *H01L 2224/81193* (2013.01); *H01L 2224/81203* (2013.01); *H01L 2224/81801* (2013.01); *H01L 2224/83193* (2013.01); *H01L 2224/83203* (2013.01); *H01L 2224/83862* (2013.01); *H01L 2224/9202* (2013.01); *H01L 2224/9211* (2013.01); *H01L 2224/94* (2013.01); *H01L 2924/13091* (2013.01); *H01L 2924/15788* (2013.01)

(56) References Cited

U.S. PATENT DOCUMENTS

| 8,729,698 | B2 | 5/2014 | Morifuji et al. |
| 2009/0321956 | A1* | 12/2009 | Sasaki ............... H01L 21/6835 257/777 |
| 2011/0074017 | A1 | 3/2011 | Morifuji et al. |
| 2014/0027933 | A1* | 1/2014 | Zhang ................ H01L 22/34 257/797 |
| 2014/0220740 | A1 | 8/2014 | Morifuji et al. |

* cited by examiner

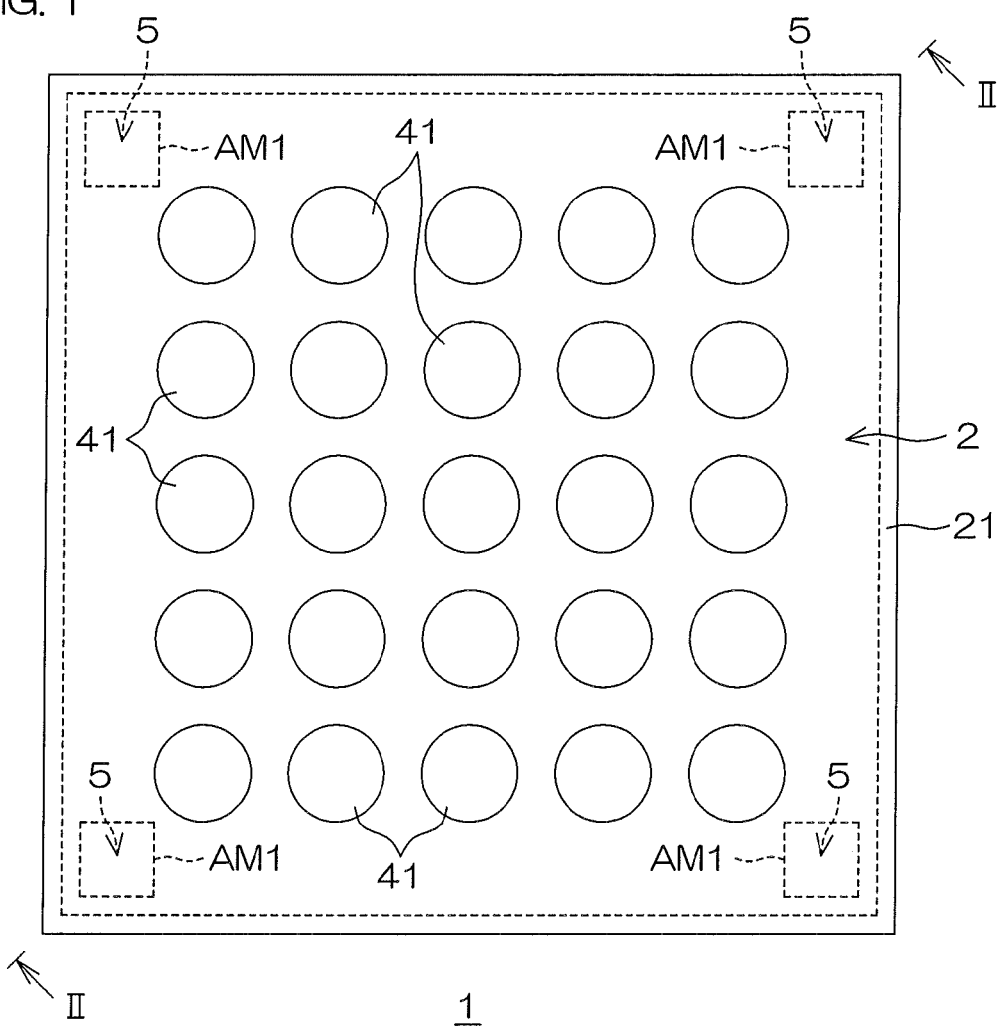

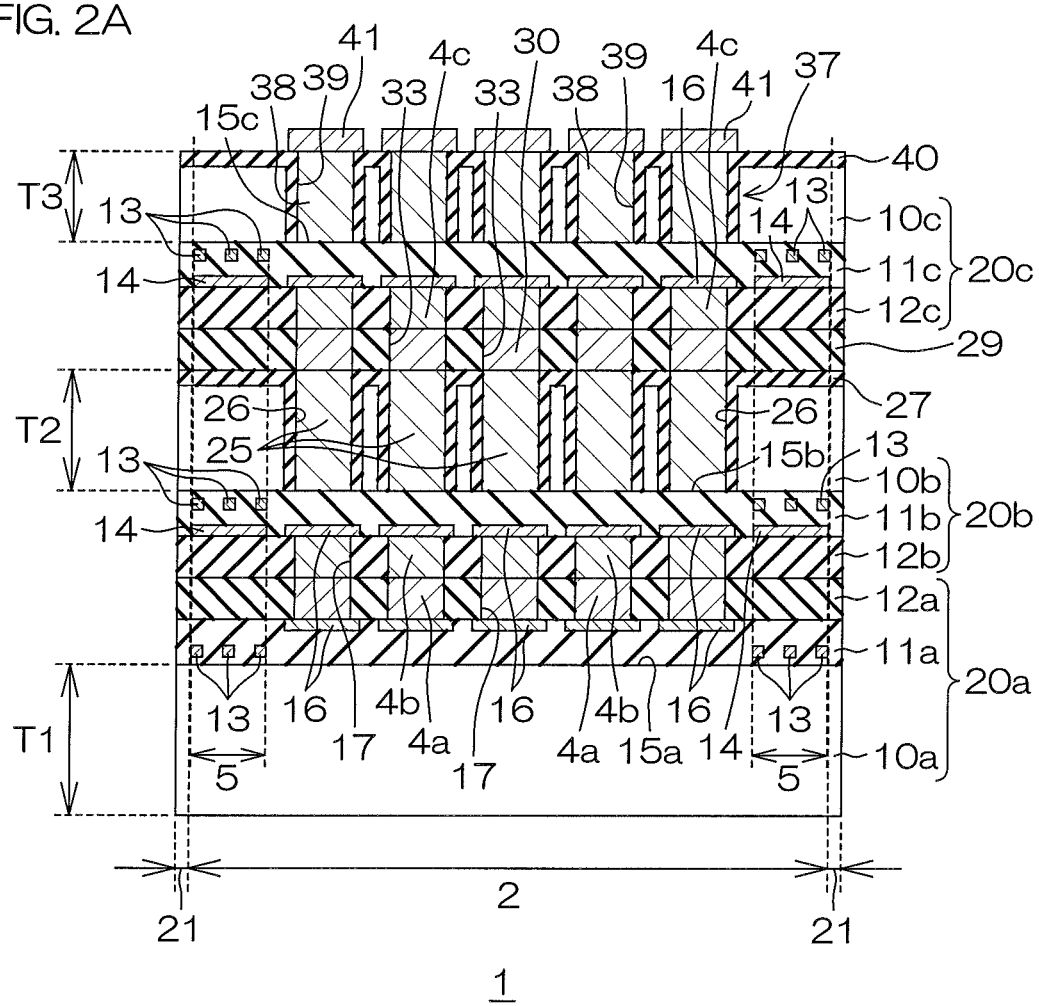

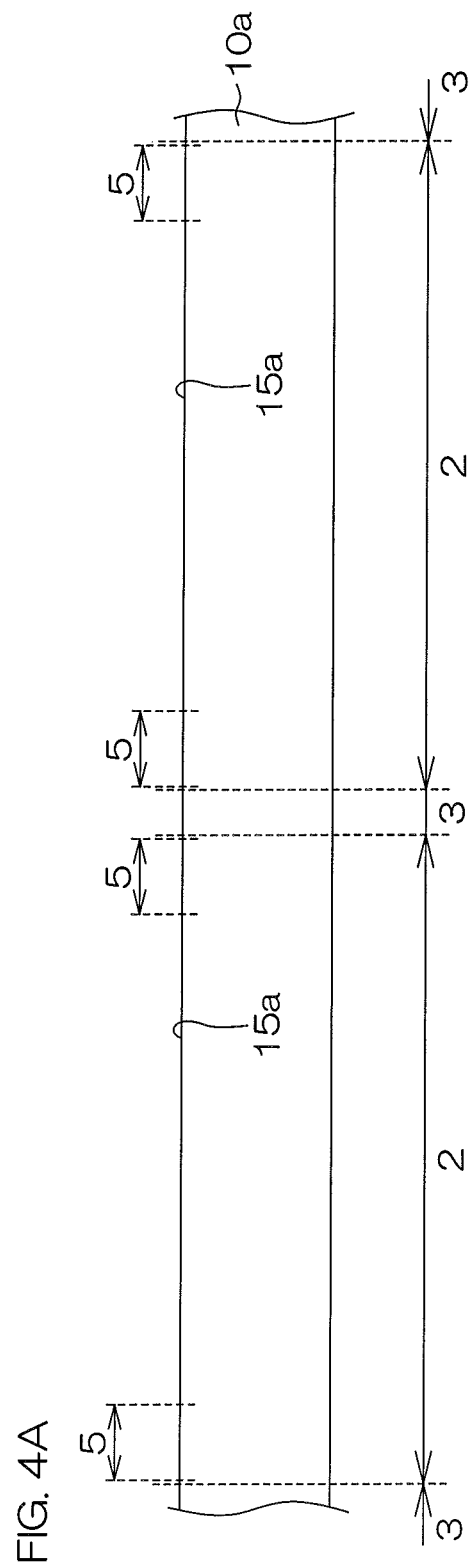

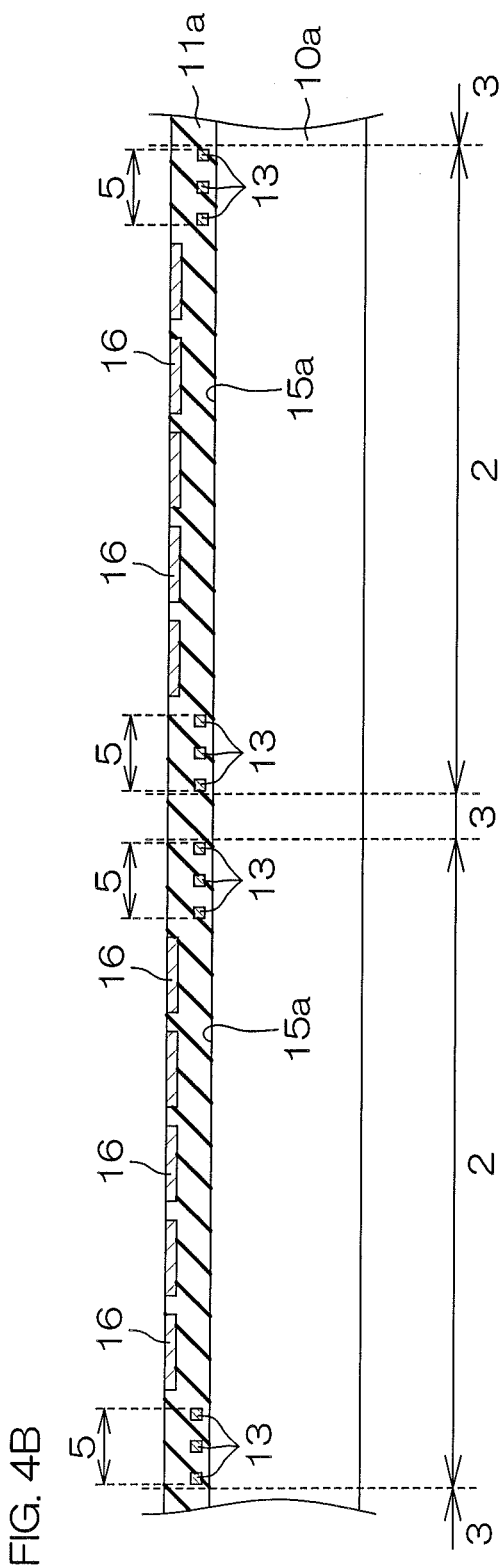

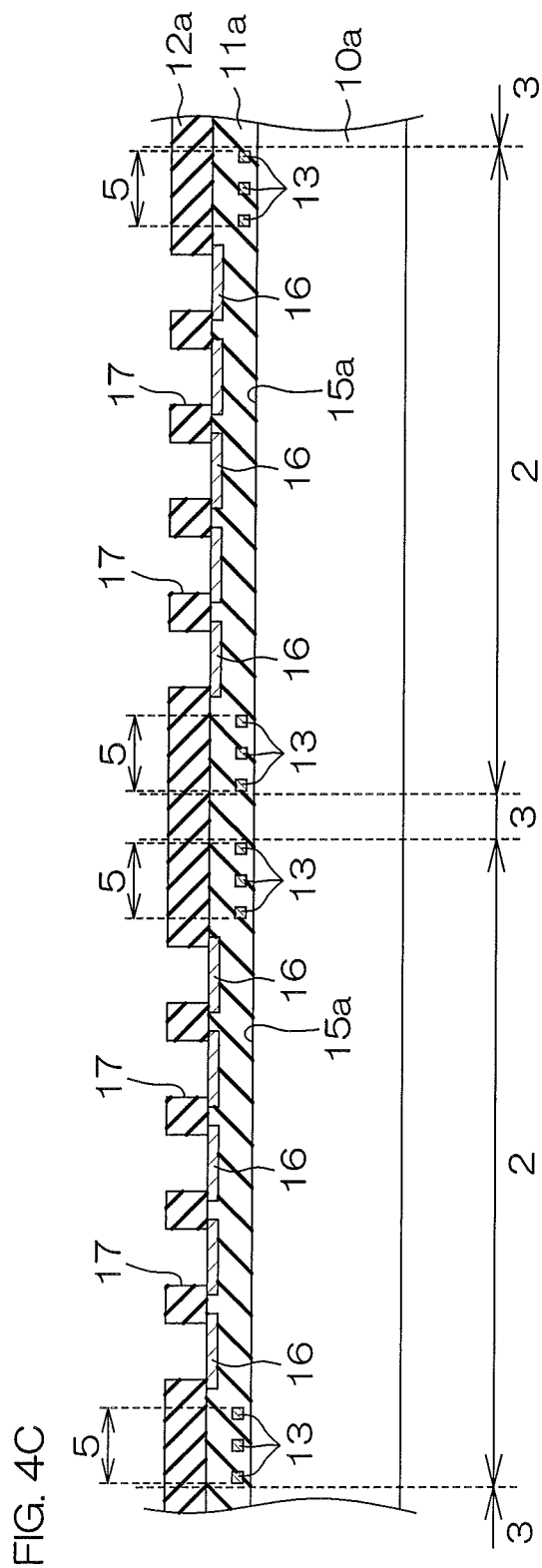

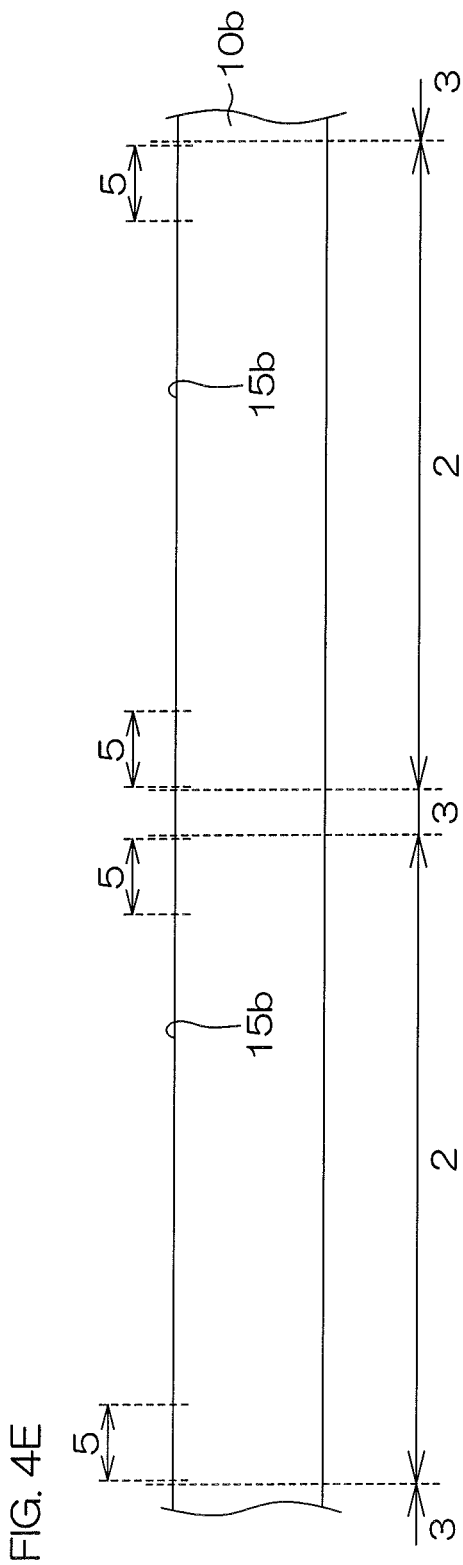

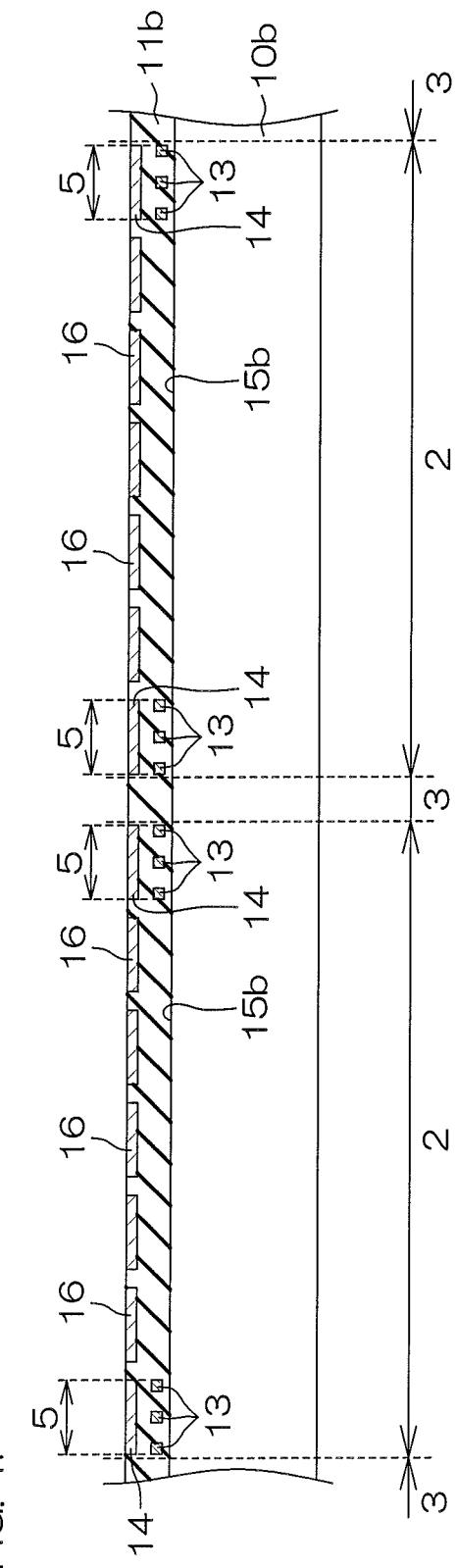

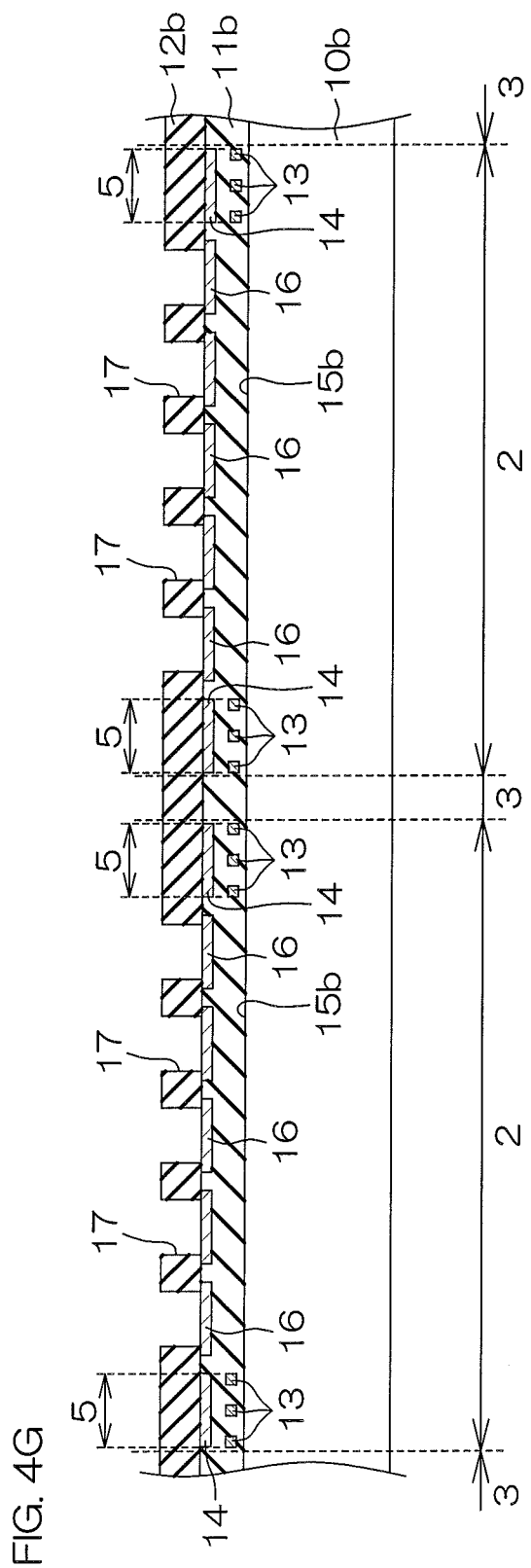

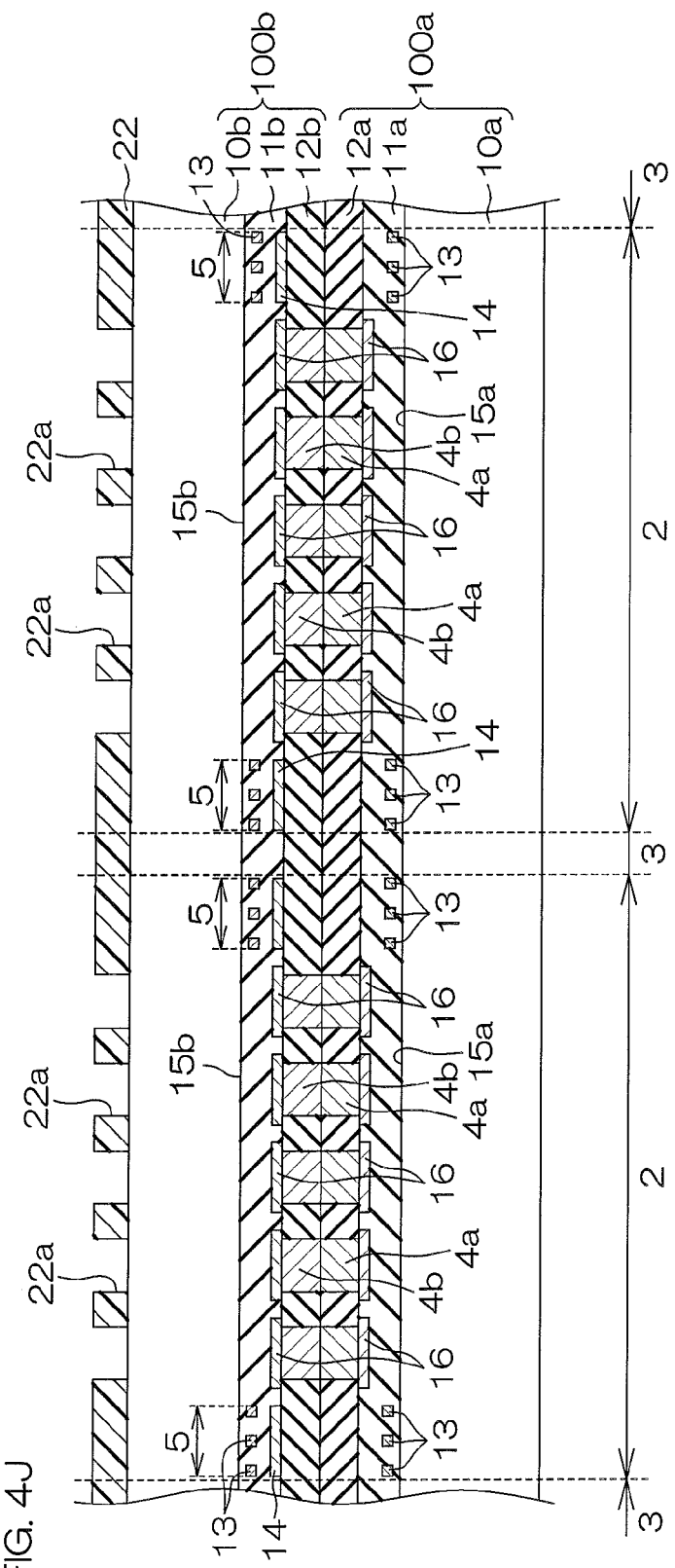

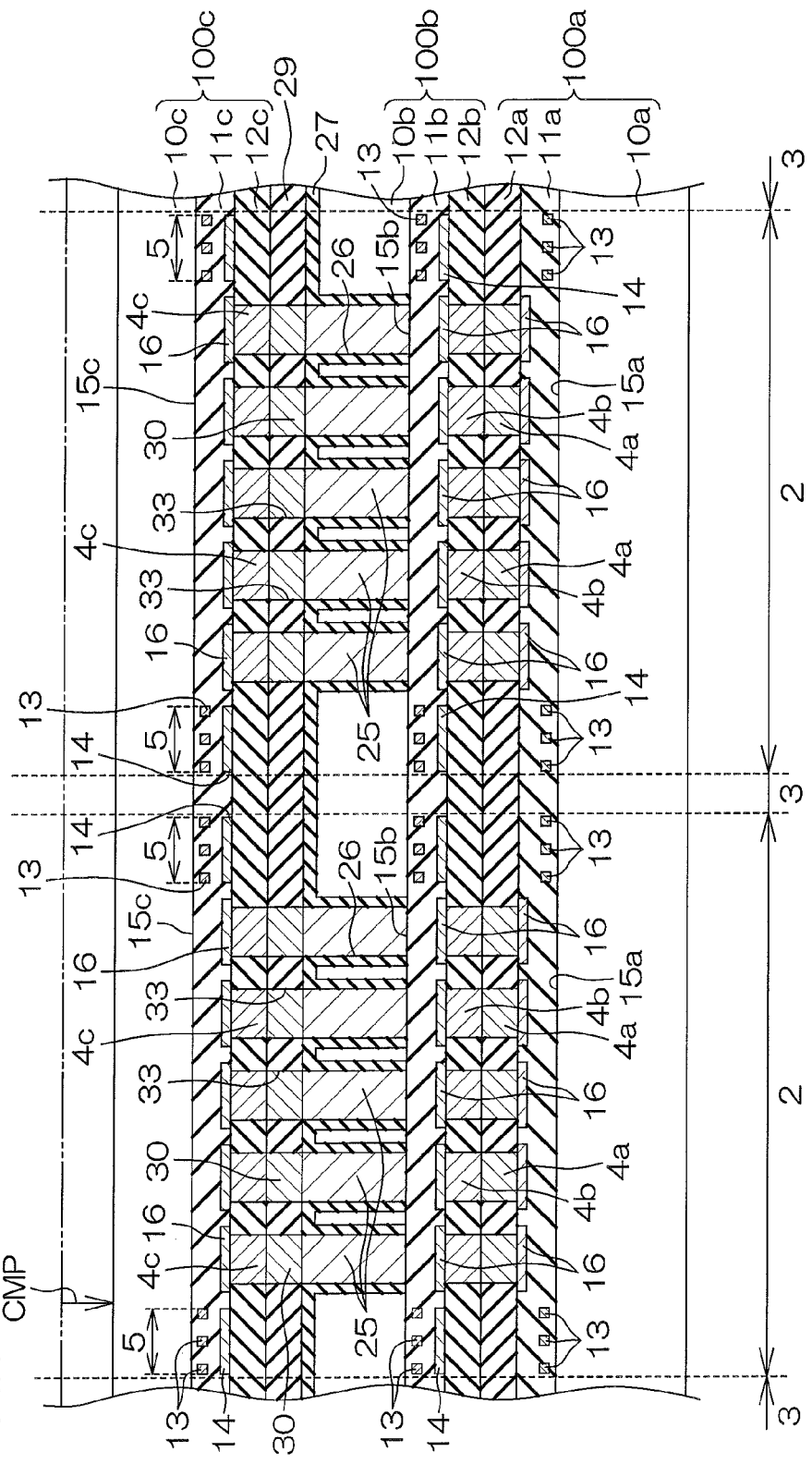

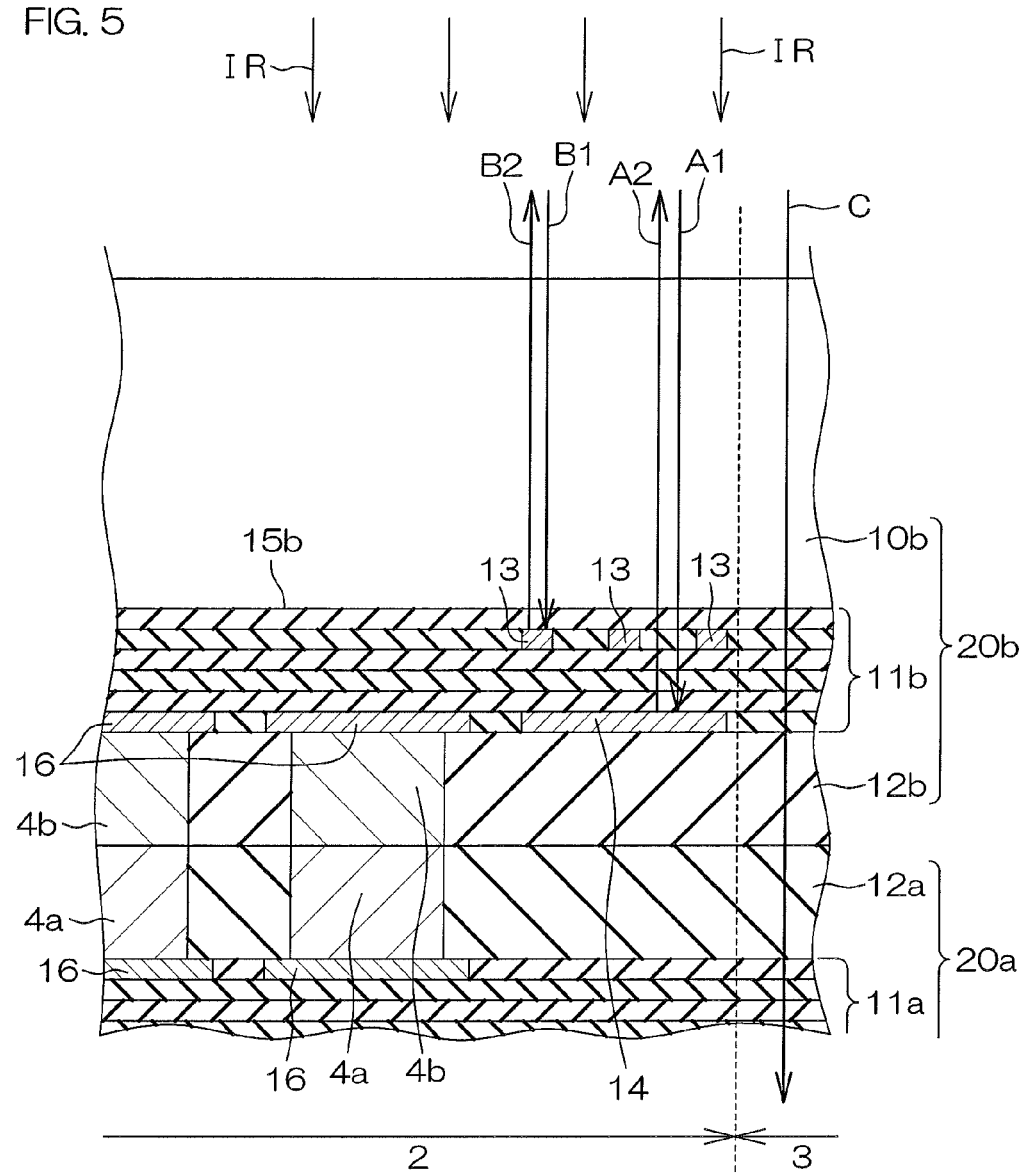

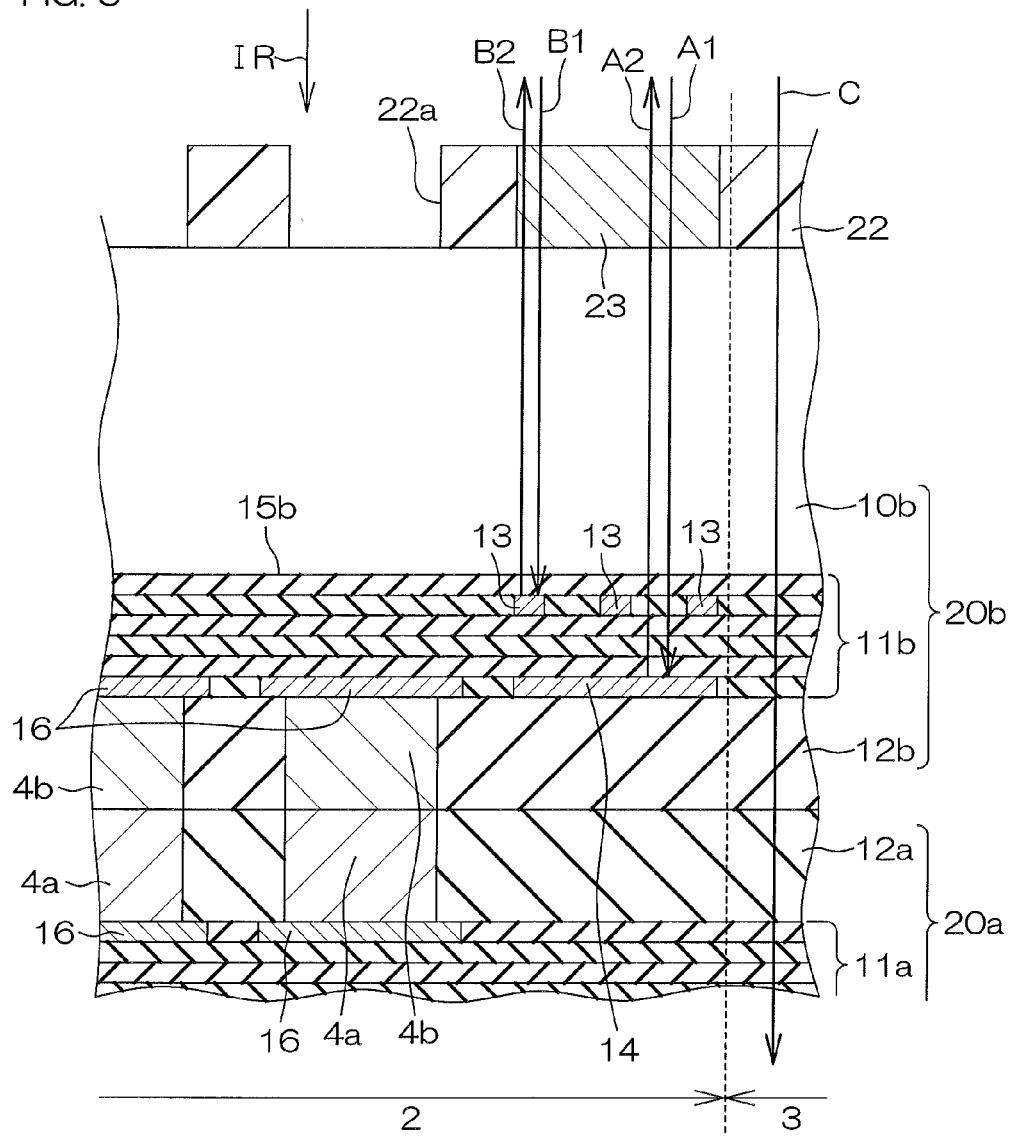

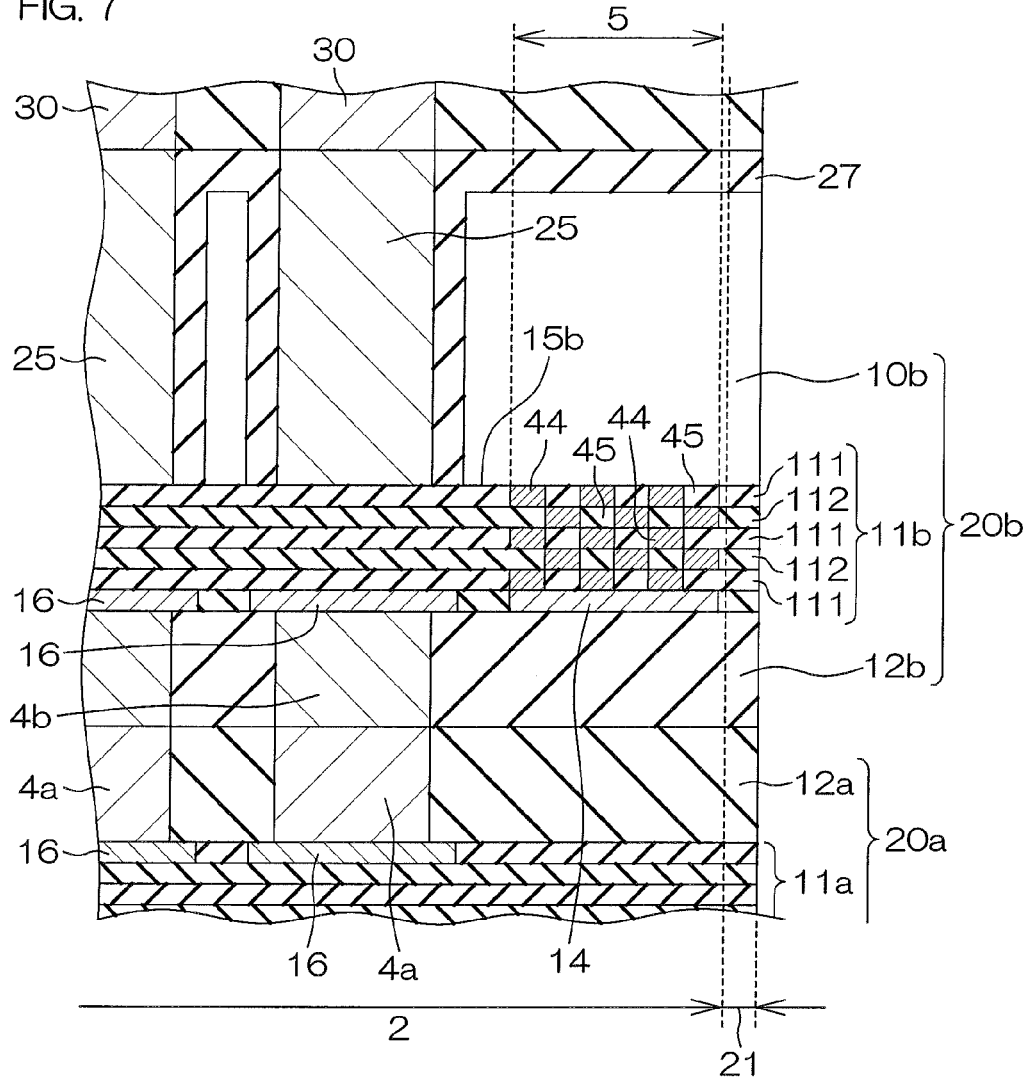

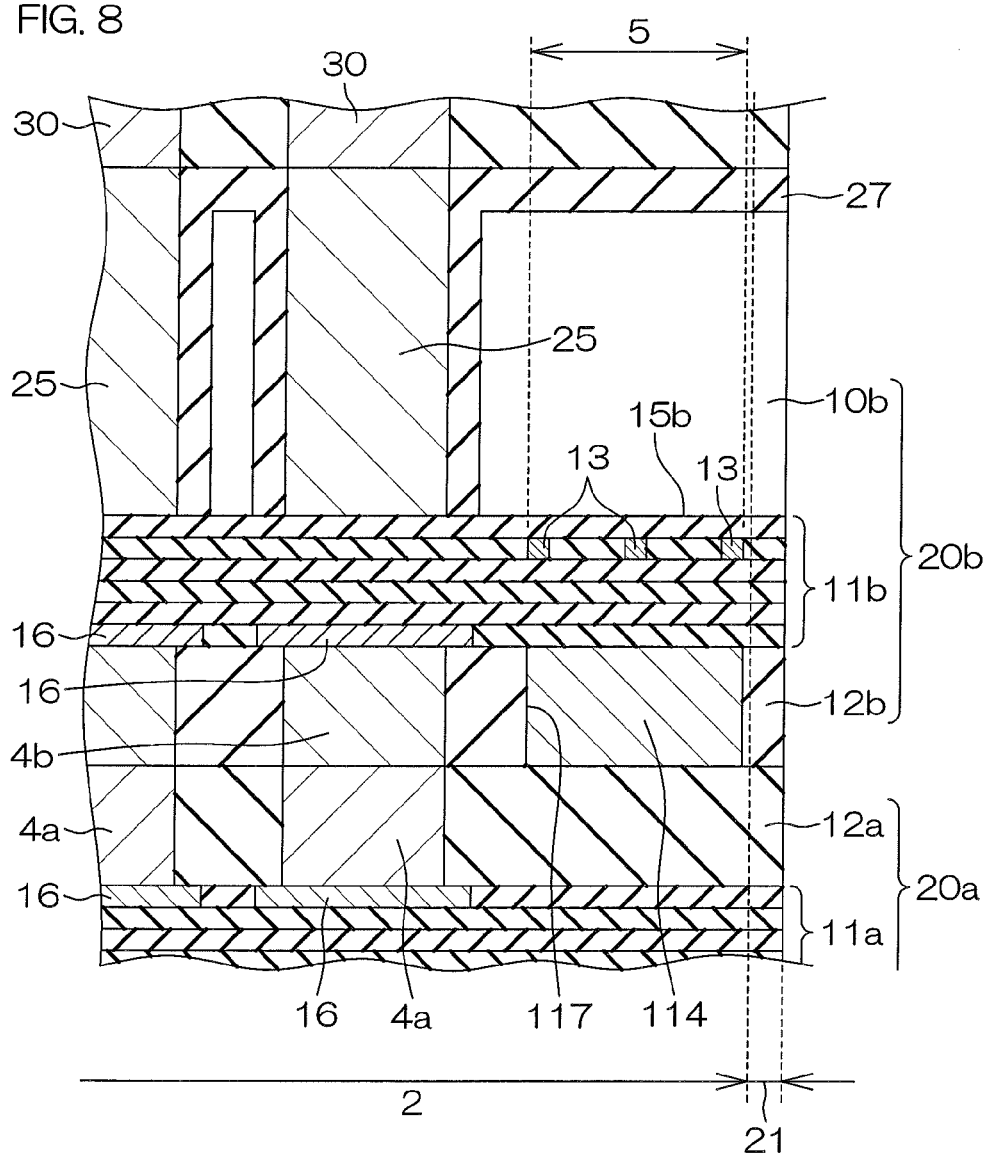

AM3

STACKED CHIPS WITH THROUGH ELECTRODES

CROSS-REFERENCE TO RELATED APPLICATIONS

This application corresponds to Japanese Patent Application No. 2013-240096 filed in the Japan Patent Office on Nov. 20, 2013, the disclosure of which is incorporated herein by reference in its entirety.

FIELD OF THE INVENTION

The present invention relates to a semiconductor device and a semiconductor device production method.

BACKGROUND ART

Patent Document 1 (JP-2011-71441A) discloses a stacked wafer structure which includes semiconductor wafers each including a plurality of semiconductor chips and stacked one on another. The stacked semiconductor wafers are connected to each other via bumps and silicon through-vias provided in the respective semiconductor wafers. The stacked wafer structure is cut along predetermined dicing lines defined between the semiconductor chips to be thereby divided into the individual semiconductor chips.

BRIEF SUMMARY OF THE INVENTION

In a production process, a semiconductor device including a plurality of semiconductor chips stacked one on another is produced, for example, by employing a Via-Last (Back-Via) method in which through-electrodes are formed after a plurality of semiconductor wafers are stacked one on another.

In the Via-Last method, the semiconductor wafers are stacked one on another, and then a mask for the formation of the through-electrodes is positioned on the resulting stacked wafer structure based on an alignment mark detected by an exposure machine (e.g., infrared microscope). More specifically, a light beam applied to the semiconductor wafers from the exposure machine partly passes (is partly transmitted) through the semiconductor wafers, and is partly reflected on an alignment mark. The exposure machine detects the alignment mark based on the reflected light. The positioning of the mask for the formation of the through-electrodes is based on the alignment mark thus detected. Then, the through-electrodes are formed in the semiconductor wafers with the use of the mask.

As the integration density and the complexity of the semiconductor device are increased, unnecessary information (e.g., electrically conductive material layers for formation of a plurality of wiring layers and the like) is more liable to be detected by the exposure machine depending on the position of the alignment mark. As a result, it is difficult to accurately detect the alignment mark. Without consideration of this problem, the prior art disclosed in Patent Document 1 has difficulty in the positioning of the mask for the formation of the through-electrodes, failing to form the through-electrodes at accurate positions.

The present invention provides a semiconductor device which includes a plurality of semiconductor chips stacked one on another and permits accurate positioning of through-electrodes therein, and a production method for the semiconductor device.

BRIEF DESCRIPTION OF THE DRAWINGS

FIG. 1 is a schematic plan view illustrating a semiconductor device according to a first embodiment of the present invention.

FIG. 2A is a sectional view taken along a sectional plane II-II in FIG. 1.

FIG. 5 is a diagram for explaining the step of FIG. 4J.

FIG. 6 is a diagram for explaining the step of FIG. 4J.

FIG. 7 is a sectional view showing a first alignment formation region of a semiconductor device according to a second embodiment of the present invention.

FIG. 8 is a sectional view showing a first alignment formation region of a semiconductor device according to a third embodiment of the present invention.

DETAILED DESCRIPTION OF THE INVENTION

Figure 2B:
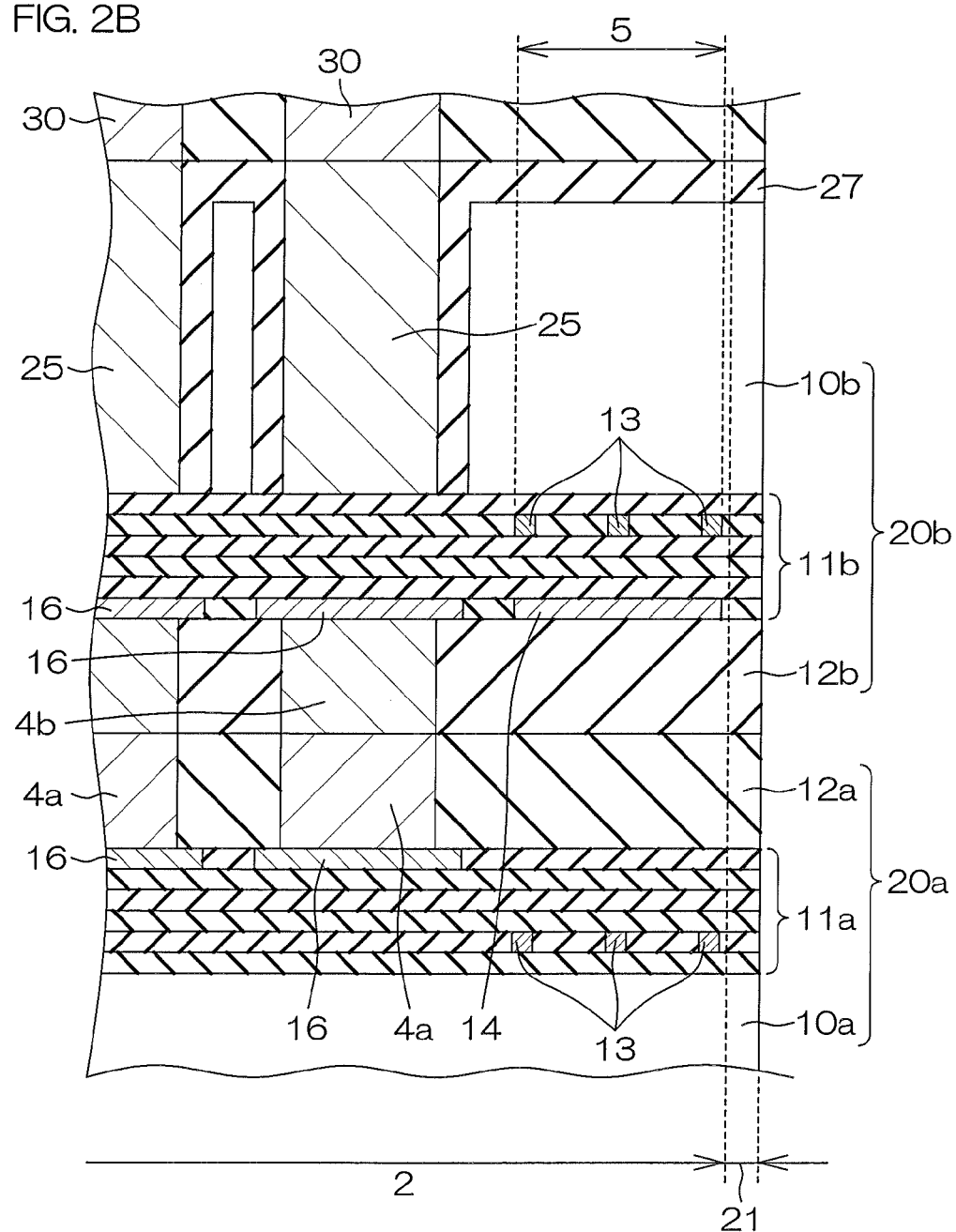
FIG. 2B is a sectional view showing a first alignment formation region shown in FIG. 2A on an enlarged scale.

According to an embodiment of the present invention, there is provided a semiconductor device, which includes: a combination object; and a chip having a front surface opposed to a front surface of the combination object. The chip includes: a multi-level wiring structure provided in the front surface of the chip; a connection electrode provided in the multi-level wiring structure and electrically connected to the combination object; an alignment mark set provided in the multi-level wiring structure and electrically isolated from the connection electrode; and an electrically conductive film provided at a higher level than the alignment mark set in association with the multi-level wiring structure to cover the alignment mark set, and electrically isolated from the connection electrode.

The semiconductor device can be produced by a semiconductor device production method which includes the steps of: forming a multi-level wiring structure on a front surface of a semiconductor substrate, the multi-level wiring structure having a connection electrode provided in a surface thereof for external electrical connection; and stacking the semiconductor substrate on a combination object with the front surface of the semiconductor substrate facing down. The multi-level wiring structure forming step includes the steps of: forming an alignment mark set in the multi-level wiring structure; and forming an electrically conductive film at a higher level than the alignment mark set to cover the alignment mark set.

In the production method, the semiconductor substrate is stacked on the combination object with its front surface facing down. When the semiconductor substrate stacked on the combination object is seen in a direction normal to a back surface thereof, therefore, the alignment mark set formed in the multi-level wiring structure is covered with the electrically conductive film from a lower side of the alignment mark set. A single alignment mark is defined by the alignment mark set and the electrically conductive film.

For detection of the alignment mark with this arrangement, light is applied to the back surface of the semiconductor substrate from an exposure machine. Light incident on a region not formed with the electrically conductive film and the alignment mark set passes through the semiconductor substrate and/or the combination object without being reflected on the electrically conductive film and the alignment mark set. Therefore, the light incident on this region is not detected by the exposure machine and, if being detected, contains a great amount of unnecessary information.

On the other hand, light incident on a region formed with the electrically conductive film and the alignment mark set is reflected on the electrically conductive film and the alignment mark set. The reflected light travels along a light path extending from reflective surfaces of the electrically conductive film and the alignment mark set to the exposure machine through the semiconductor substrate, and is detected by the exposure machine. In addition, the electrically conductive film is located below the alignment mark set, thereby effectively suppressing reflection of the light on a layer located further below the electrically conductive film. This makes it easy to provide contrast between the region formed with the electrically conductive film and the alignment mark set and the region not formed with the electrically conductive film and the alignment mark set. Therefore, the exposure machine can properly detect the light reflected on the electrically conductive film and the alignment mark set (i.e., alignment mark). As a result, a mask for formation of a through-electrode can be accurately positioned on the back surface of the semiconductor substrate in a subsequent process step. This makes it possible to form the through-electrode at an accurate position.

According to another embodiment of the present invention, the chip further includes a through-electrode provided in the semiconductor substrate. For the production of the semiconductor device, the semiconductor device production method further includes a mask positioning step of positioning a mask formed selectively with an opening for formation of a through-electrode on a back surface of the semiconductor substrate after the stacking step, and a through-electrode forming step of forming the through-electrode in the semiconductor substrate with the use of the mask.

This production method employs the Via-Last (Back-Via) method in which the through-electrode is formed after the semiconductor substrate is stacked on the combination object. The mask for the formation of the through-electrode is positioned based on the alignment mark detected by the exposure machine. As a result, the mask can be accurately positioned on the back surface of the semiconductor substrate, so that the through-electrode can be formed at a proper position in the semiconductor substrate.

Therefore, an additional mark to be associated with the alignment mark set is provided in the mask. The production method preferably further includes the steps of: detecting the alignment mark set by means of an exposure machine before the mask positioning step after the stacking step; and determining a mask position with respect to the back surface of the semiconductor substrate based on the detected alignment mark set and the additional mark before the mask positioning step after the detecting step.

According to further another embodiment of the present invention, the electrically conductive film is provided at the same level as the connection electrode. For the production of the semiconductor device, the electrically conductive film forming step includes the step of forming the electrically conductive film at the same level as that of the connection electrode in the semiconductor device production method.

In the production method, the electrically conductive film and the connection electrode can be formed in the same process step. This simplifies the production process.

According to still another embodiment of the present invention, the connection electrode is electrically connected to the combination object via a bump provided on the multi-level wiring structure. For the production of the semiconductor device, the semiconductor device production method further includes the step of forming a bump on the connection electrode before the stacking step so that the bump is electrically connected to the connection electrode. In the production process, the stacking step includes the step of electrically connecting the bump to the combination object.

According to further another embodiment of the present invention, the electrically conductive film is provided at the same level as the bump. For the production of the semiconductor device, the bump forming step includes the step of forming the bump at the same level as that of the electrically conductive film.

In the production method, the bump and the electrically conductive film can be formed in the same process step. This simplifies the production process.

According to still another embodiment of the present invention, the alignment mark set is a set of alignment mark portions provided in the multi-level wiring structure, and is configured such that, when the semiconductor chip is seen in plan in a direction normal to the front surface thereof, the alignment mark portions are combined together into a size not smaller than the resolution of the exposure machine. For the production of the semiconductor device, the alignment mark set forming step includes the step of forming a set of alignment mark portions selectively in the multi-level wiring structure so that, when the semiconductor substrate is seen in plan in a direction normal to the front surface thereof, the alignment mark portions are combined together into a size not smaller than the resolution of the exposure machine in the semiconductor device production method.

In the production method, the alignment mark set can be properly detected by the exposure machine.

According to further another embodiment of the present invention, the alignment mark set has the same shape as the electrically conductive film as seen in plan. For the production of the semiconductor device, the alignment mark set forming step further includes the step of forming the alignment mark set in the same shape as that of the electrically conductive film as seen in plan.

The semiconductor device production method according to any of the aforementioned embodiments may further have the following inventive aspects:

According to still another embodiment of the present invention, the semiconductor substrate includes an element formation region defined by a scribing region, and the alignment mark set forming step includes the step of forming the alignment mark set in the element formation region.

According to further another embodiment of the present invention, the alignment mark set forming step further includes the step of forming the alignment mark set in the scribing region.

In the production method, alignment marks can be detected based on the alignment mark set formed in the element formation region and the alignment mark set formed in the scribing region. As a result, the mask for the formation of the through-electrode can be more accurately positioned on the back surface of the semiconductor substrate.

According to still another embodiment of the present invention, the semiconductor substrate includes an element formation region defined by a scribing region, and the alignment mark set forming step includes the step of forming the alignment mark set in the scribing region.

In the production method, the alignment mark set is simply formed in the scribing region, so that the alignment mark set is not influenced by limitation of the design rule of the element formation region. As a result, it is possible to accurately position the mask on the back surface of the semiconductor device for the formation of the through-electrode while permitting more flexible design of the semiconductor device.

According to further another embodiment of the present invention, the semiconductor device production method includes the step of dicing the semiconductor substrate along the scribing region defined on the semiconductor substrate.

Preferred embodiments of the present invention will hereinafter be described in detail with reference to the attached drawings. The construction of a semiconductor device 1 will be first described with reference to FIGS. 1 to 2B, and the construction of a wafer structure 101 to be used for production of the semiconductor device 1 will be described with reference to FIG. 3.

<Semiconductor Device>

FIG. 1 is a schematic plan view illustrating a semiconductor device 1 according to a first embodiment of the present invention.

The semiconductor device 1 has a quadrilateral shape as seen in plan in FIG. 1, and includes an element formation region 2 and a marginal region 21.

The marginal region 21, which is provided on a peripheral edge margin of the semiconductor device 1, is a region remaining after a wafer structure 101 to be described later is cut into individual semiconductor devices 1 by means of a dicing blade. The element formation region 2 is defined in a rectangular shape as seen in plan by the marginal region 21. First alignment formation regions 5 and a plurality of front side bump electrodes 41 are provided in the element formation region 2.

Alignment marks AM1 each having a quadrilateral plan shape are respectively provided in the first alignment formation regions 5. In this embodiment, the first alignment formation regions 5 are respectively located in four corners of the element formation region 2. Alternatively, the first alignment formation regions 5 may be respectively defined on longitudinally middle portions of edges of the element formation region 2.

The front side bump electrodes 41 are provided on the outermost surface of the semiconductor device 1. The front side bump electrodes 41 each have a round shape as seen in plan, and are arranged in spaced relation in a row direction and in a column direction. That is, the front side bump electrodes 41 are arranged in a matrix array in the element formation region 2. The front side bump electrodes 41 serve as external terminals of the semiconductor device 1. When electric power is applied to the front side bump electrodes 41, the electric power is supplied to the semiconductor device 1.

FIG. 2A is a sectional view taken along a sectional plane II-II in FIG. 1. FIG. 2B is a sectional view showing the first alignment formation region 5 shown in FIG. 2A on an enlarged scale.

In this embodiment, the semiconductor device 1 has a construction such that a plurality of semiconductor chips are stacked one on another. In this embodiment, three semiconductor chips (first to third semiconductor chips 20a, 20b, 20c) are stacked one on another by way of example, but more than three semiconductor chips may be stacked one on another. In this case, the first semiconductor chip 20a is a combination object for the second semiconductor chip 20b, and the first and second semiconductor chips 20a, 20b are a combination object for the third semiconductor chip 20c in the present invention.

The semiconductor chips 20a, 20b, 20c respectively have semiconductor substrates 10a, 10b, 10c of silicon substrates. Semiconductor elements and passive elements such as transistors, MOSFETs, resistors and capacitors are provided selectively in the element formation region 2 in each of the semiconductor substrates 10a, 10b, 10c. Surfaces of the semiconductor substrates 10a, 10b, 10c formed selectively with the semiconductor elements, the passive elements and the like are hereinafter referred to as active surfaces 15a, 15b, 15c, respectively.

The first semiconductor chip 20a is provided as a support base at the lowermost level with the active surface 15a of the first semiconductor substrate 10a facing up. The first semiconductor chip 20a includes a wiring layer 11a provided on the active surface 15a, and an insulation layer 12a provided on the wiring layer 11a. The first semiconductor substrate 10a has a thickness T1 of 700 μm to 800 μm.

The wiring layer 11a has a multi-level wiring structure. In the element formation region 2, the wiring layer 11a includes top metal portions 16, and a plurality of alignment metal portions 13 (alignment mark set (a set of alignment mark portions) in the present invention) provided in each of the first alignment formation regions 5.

The alignment metal portions 13 are provided at a lower level than the outermost surface of the wiring layer 11a (in the second sublayer in this embodiment). In this embodiment, the alignment metal portions 13 are provided in spaced relation at the same level in the first alignment formation region 5. The alignment metal portions 13 are electrically isolated from [the semiconductor elements and the like of] the first and second semiconductor chips 20a, 20b.

Although the alignment metal portions 13 are provided in spaced relation at the same level as shown in section in FIG. 2B by way of example in this embodiment, some of the alignment metal portions 13 may be combined together.

The top metal portions 16 are exposed in the outermost surface of the wiring layer 11a. The top metal portions 16 are electrically connected to the semiconductor elements and the like provided in the active surface 15a of the first semiconductor substrate 10a.

The insulation layer 12a is provided on the wiring layer 11a as covering the top metal portions 16. The insulation layer 12a has a thickness of, for example, 3 μm to 5 μm. The insulation layer 12a is preferably an organic insulation layer composed of an organic insulative material such as containing a polyimide or a carbon polyimide, but may be made of an insulative material such as silicon oxide or silicon nitride. In this embodiment, the insulation layer 12a has a single layer structure, but may have a multi-layer structure including a plurality of sublayers. In the element formation region 2, a plurality of bump electrodes 4a are provided in the insulation layer 12a.

As shown in FIG. 2A, the bump electrodes 4a are composed of an electrically conductive material, and respectively buried in through-holes 17. The through-holes 17 extend thicknesswise through the insulation layer 12a to expose the top metal portions 16. The electrically conductive material for the bump electrodes 4a is buried in the through-holes 17 so as to be flush with a surface of the insulation layer 12a. The bump electrodes 4a are electrically connected to the semiconductor elements and the like provided in the active surface 15a of the first semiconductor substrate 10a via the top metal portions 16 (wiring layer 11a). Examples of the electrically conductive material for the bump electrodes 4a include Cu (copper), Au (gold), Sn (tin) and SnAg (tin-silver). In this embodiment, the bump electrodes 4a are provided at positions overlapping the front side bump electrodes 41 and have the same shape as the front side bump electrodes 41 as seen in plan by way of example, but may be provided at positions different from those of the front side bump electrodes 41.

The second semiconductor chip 20b is stacked on the first semiconductor chip 20a with the active surface 15b opposed to the active surface 15a of the first semiconductor chip 20a. The second semiconductor chip 20b includes a wiring layer 11b provided on the active surface 15b, and an insulation layer 12b provided on the wiring layer 11b.

The second semiconductor chip 20b differs from the first semiconductor chip 20a in that an alignment top metal portion 14 (electrically conductive film in the present invention) is provided in addition to the alignment metal portions 13 in the first alignment formation region 5, in that the second semiconductor substrate 10b is thinner than the first semiconductor substrate 10a, and in that a plurality of first via-electrodes 25 (through-electrode in the present invention) are provided in the second semiconductor substrate 10b. The other arrangement is the same as that of the first semiconductor chip 20a.

The second semiconductor chip 20b is stacked on the first semiconductor chip 20a so that bump electrodes 4b of the semiconductor chip 20b are respectively connected to the bump electrodes 4a of the first semiconductor chip 20a. That is, the first and second semiconductor chips 20a, 20b are electrically and mechanically connected to each other via the bump electrodes 4a, 4b. The second semiconductor substrate 10b has a thickness T2 of, for example, 10 μm to 100 μm.

As shown in FIG. 2B, the alignment top metal portion 14 is provided at a higher level than the alignment metal portions 13 (as seen in section in FIG. 2B, at a lower level than the alignment metal portions 13). In other words, the alignment metal portions 13 are provided between the alignment top metal portion 14 and the front surface of the second semiconductor substrate 10b in the first alignment formation region 5. The alignment top metal portion 14 covers a region formed with the alignment metal portions 13, and has the same pattern as a pattern collectively defined by the plurality of alignment metal portions 13. In this embodiment, the alignment top metal portion 14 is provided as an uppermost wiring which is exposed in a surface of the wiring layer 11b in the first alignment formation region 5.

The alignment metal portions 13 and the alignment top metal portion 14 define a single alignment mark AM1. The alignment mark AM1 is detected by an exposure machine. An example of the exposure machine is an infrared microscope which detects the alignment mark AM1 with infrared radiation. Therefore, the alignment metal portions 13 and the alignment top metal portion 14 are preferably collectively dimensioned so as to be not smaller than the resolution of the exposure machine. Where the resolution of the exposure machine is x μm, the alignment metal portions 13 and the alignment top metal portion 14 are preferably dimensioned so as to collectively have an area not smaller than the resolution of the exposure machine (i.e., not smaller than x μm$^2$) as seen in plan. Where the infrared microscope is used as the exposure machine, the alignment metal portions 13 and the alignment top metal portion 14 are preferably made of an electrically conductive material reflective to the infrared radiation. Examples of the electrically conductive material for the alignment metal portions 13 and the alignment top metal portion 14 include Al (aluminum), Cu and W (tungsten).

As shown in FIG. 2A, first via-electrodes 25 electrically connected to the wiring layer 11b are provided in the semiconductor substrate 10b. In this embodiment, the first via-electrodes 25 are respectively located at positions overlapping the bump electrodes 4a, 4b and have the same shape as the bump electrodes 4a, 4b as seen in plan by way of example. The first via-electrodes 25 are TSVs (Through-Silicon Vias) which are through-electrodes extending through the silicon substrate.

The first via-electrodes 25 are composed of an electrically conductive material, and respectively buried in through-holes 26. The through-holes 26 extend thicknesswise through the second semiconductor substrate 10b, and each have a bottom located on the wiring layer 11b of the second semiconductor chip 20b. An insulation film 27 is provided on a back surface of the semiconductor substrate 10b including side surfaces of the through-holes 26. The insulation film 27 is, for example, a silicon oxide film. The first via-electrodes 25 of the electrically conductive material are respectively buried in the through-holes 26 with the intervention of portions of the insulation film 27 provided on the side surfaces of the through-holes 26. Examples of the electrically conductive material for the first via-electrodes 25 include Cu, Au, Sn and SnAg.

The first via-electrodes 25 are not necessarily required to be respectively located at the positions overlapping the bump electrodes 4a, 4b as seen in plan, but may be located at positions different from those of the bump electrodes 4a, 4b and connected to the bump electrodes 4a, 4b, for example, via routing wirings or the like (not shown). The first via-electrodes 25 may be configured and dimensioned differently from the bump electrodes 4a, 4b.

A back side insulation layer 29 and a plurality of back side bump electrodes 30 electrically connected to the first via-electrodes 25 are provided on the back surface of the second semiconductor substrate 10b.

The back side insulation layer 29 is provided on the back surface of the second semiconductor substrate 10b as covering the first via-electrodes 25. The back side insulation layer 29 has a thickness of, for example, 3 μm to 5 μm. The back side insulation layer 29 is preferably an organic insulation layer composed of an organic insulative material such as containing a polyimide or a carbon polyimide, but may be made of an insulative material such as silicon oxide or silicon nitride.

The back side bump electrodes 30 are composed of an electrically conductive material, and respectively buried in through-holes 33. The through-holes 33 extend thicknesswise through the back side insulation layer 29 so as to expose the first via-electrodes 25. The electrically conductive material for the back side bump electrodes 30 is deposited in the through-holes 33 so as to be flush with a surface of the back side insulation layer 29. The back side bump electrodes 30 are respectively combined integrally with the first via-electrodes 25 to be electrically connected to the first via-electrodes 25. That is, the back side bump electrodes 30 are electrically connected to the first and second semiconductor chips 20a, 20b via the first via-electrodes 25. Examples of the electrically conductive material for the back side bump electrodes 30 include Cu, Au, Sn and SnAg.

In this embodiment, the back side bump electrodes 30 are respectively located on the first via-electrodes 25 by way of example, but may be located at positions different from those of the first via-electrodes 25 and connected to the first via-electrodes 25, for example, via routing wirings.

The third semiconductor chip 20c is stacked on the back surface (i.e., a surface opposite from the active surface 15b) of the second semiconductor chip 20b with the active surface 15c opposed to the back surface of the second semiconductor chip 20b. The third semiconductor chip 20c includes a wiring layer 11c provided on the active surface 15c, and an insulation layer 12c provided on the wiring layer 11c.

The third semiconductor chip 20c differs from the second semiconductor chip 20b in that a plurality of second via-electrodes 38 (through-electrode in the present invention) are provided in the third semiconductor substrate 10c, and in that the front side bump electrodes 41 are provided on a back surface of the third semiconductor substrate 10c. The other arrangement is the same as that of the second semiconductor chip 20b. Like the second semiconductor substrate 10b, the third semiconductor substrate 10c is thinner than the first semiconductor substrate 10a of the first semiconductor chip 20a, and has a thickness T3 of, for example, 10 μm to 100 μm.

The third semiconductor chip 20c is stacked on the back surface of the second semiconductor substrate 10b so that the bump electrodes 4c are respectively connected to the back side bump electrodes 30. That is, the second and third semiconductor chips 20b, 20c are electrically and mechanically connected to each other via the bump electrodes 4c and the back side bump electrodes 30.

In this embodiment, the second via-electrodes 38 are respectively located at positions overlapping the bump electrodes 4c and have the same shape as the bump electrodes 4c as seen in plan by way of example. Like the first via-electrodes 25, the second via-electrodes 38 are TSVs.

The second via-electrodes 38 are composed of an electrically conductive material, and respectively buried in through-holes 39. The through-holes 39 extend thicknesswise through the third semiconductor substrate 10c, and each have a bottom located on the wiring layer 11c of the third semiconductor chip 20c. An insulation film 40 is provided on the back surface of the third semiconductor substrate 10c including side surfaces of the through-holes 39. The insulation film 40 is, for example, a silicon oxide film. The second via-electrodes 38 of the electrically conductive material are respectively buried in the through-holes 39 with the intervention of portions of the insulation film 40 formed on the side surfaces of the through-holes 39. Examples of the electrically conductive material for the second via-electrodes 38 include Cu, Au, Sn and SnAg.

The second via-electrodes 38 are not necessarily required to be respectively located at the positions overlapping the bump electrodes 4c, but may be located at positions different from those of the bump electrodes 4c and connected to the bump electrodes 4c, for example, via routing wirings (not shown). The second via-electrodes 38 may be dimensioned and configured differently from the bump electrodes 4c.

The front side bump electrodes 41 are provided on the back surface of the third semiconductor substrate 10c as covering the second via-electrodes 38. Examples of the electrically conductive material for the front side bump electrodes 41 include Cu, Au, Sn and SnAg.

The semiconductor device 1 described above can be provided by dicing (dividing) the wafer structure 101 to be described below.

<Wafer Structure>

Figure 3:
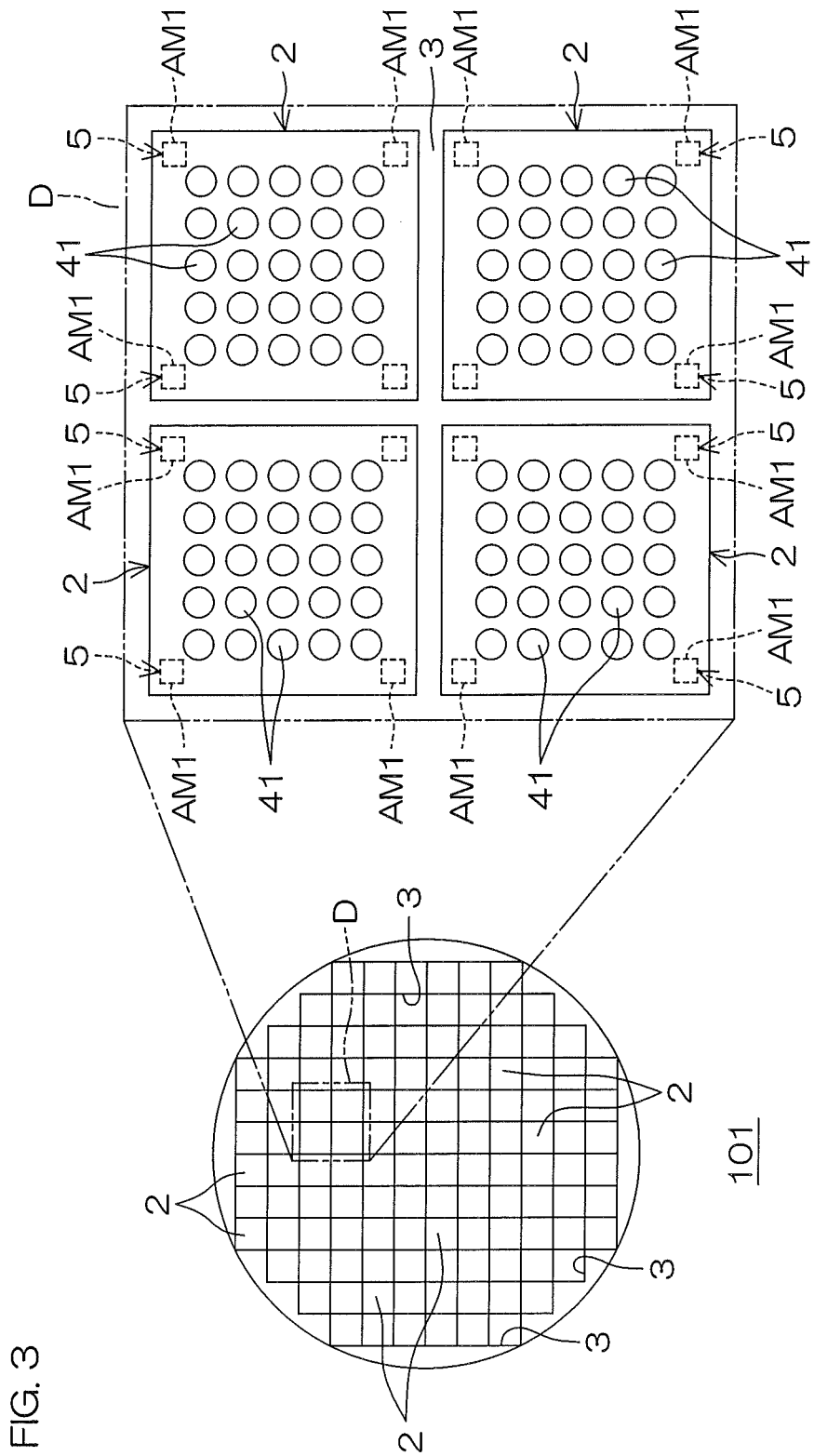
FIG. 3 is a schematic plan view showing a wafer structure according to the first embodiment of the present invention.

FIG. 3 is a schematic plan view showing the wafer structure 101 according to the first embodiment of the present invention. In FIG. 3, a region D of the wafer structure 101 (a region enclosed by a two-dot-and-dash line) including four element formation regions 2 is illustrated on an enlarged scale.

As shown in FIG. 3, a plurality of semiconductor devices 1 are regularly arranged in the wafer structure 101, and defined by a scribing region 3.

In the wafer structure 101, the semiconductor devices 1 are arranged in spaced relation in a row direction and in a column direction. That is, the semiconductor devices 1 are arranged in a matrix array in the wafer structure 101.

The scribing region 3 is a region along which the wafer structure is diced by means of a dicing blade. As shown in FIG. 3, the scribing region has a mesh-like shape which defines the respective semiconductor devices 1. The wafer structure 101 is diced along the scribing region 3, whereby the semiconductor devices 1 each including the element formation region 2 and the marginal region 21 are separated from each other. Thus, the semiconductor devices 1 each shown in FIGS. 1 to 2B are provided.

The semiconductor device 1 and the wafer structure 101 described above can be produced through process steps shown in FIGS. 4A to 4O.

<Semiconductor Device Production Method>

FIGS. 4A to 4O are sectional views for explaining an exemplary production process for the semiconductor device 1 shown in FIG. 1.

For production of the semiconductor device 1, as shown in 4A, a first semiconductor substrate 10a is prepared for formation of first semiconductor chips 20a (combination object). Then, element formation regions 2, a scribing region 3 and first alignment formation regions 5 are defined on the first semiconductor substrate 10a. In turn, semiconductor elements and passive elements such as transistors, MOSFETs, resistors and capacitors are formed selectively in the element formation regions 2 of the first semiconductor substrate 10a. Thus, a surface of the first semiconductor substrate 10a formed selectively with the semiconductor elements, the passive elements and the like is defined as an active surface 15a.

Subsequently, as shown in FIG. 4B, a wiring layer 11a (multi-level wiring structure) is formed on the first semiconductor substrate 10a so as to be electrically connected to the semiconductor elements and the like formed in the active surface 15a. When the wiring layer 11a is formed, alignment metal portions 13 are simultaneously formed in the first alignment formation regions 5 so as to be electrically isolated from the active surface 15a. In this embodiment, routing wirings and the alignment metal portions 13 are simultaneously formed in the second sublayer of the wiring layer 11a. Then, top metal portions 16 are formed as uppermost wirings in the uppermost sublayer of the wiring layer 11a so as to be exposed in a surface of the wiring layer 11a.

Then, as shown in FIG. 4C, an insulative material (e.g., a photosensitive polyimide) is deposited over the top metal portions 16 to form an insulation layer 12a. In turn, the insulation layer 12a is exposed to light as having a pattern corresponding to through-holes 17 by photolithography. Then, the insulation layer 12a is heat-treated (cured). Thus, the insulation layer 12a has a thickness reduced by thermal contraction, and is hardened to have a stable film quality. Thus, the through-holes 17 are formed (developed).

Figure 4D:
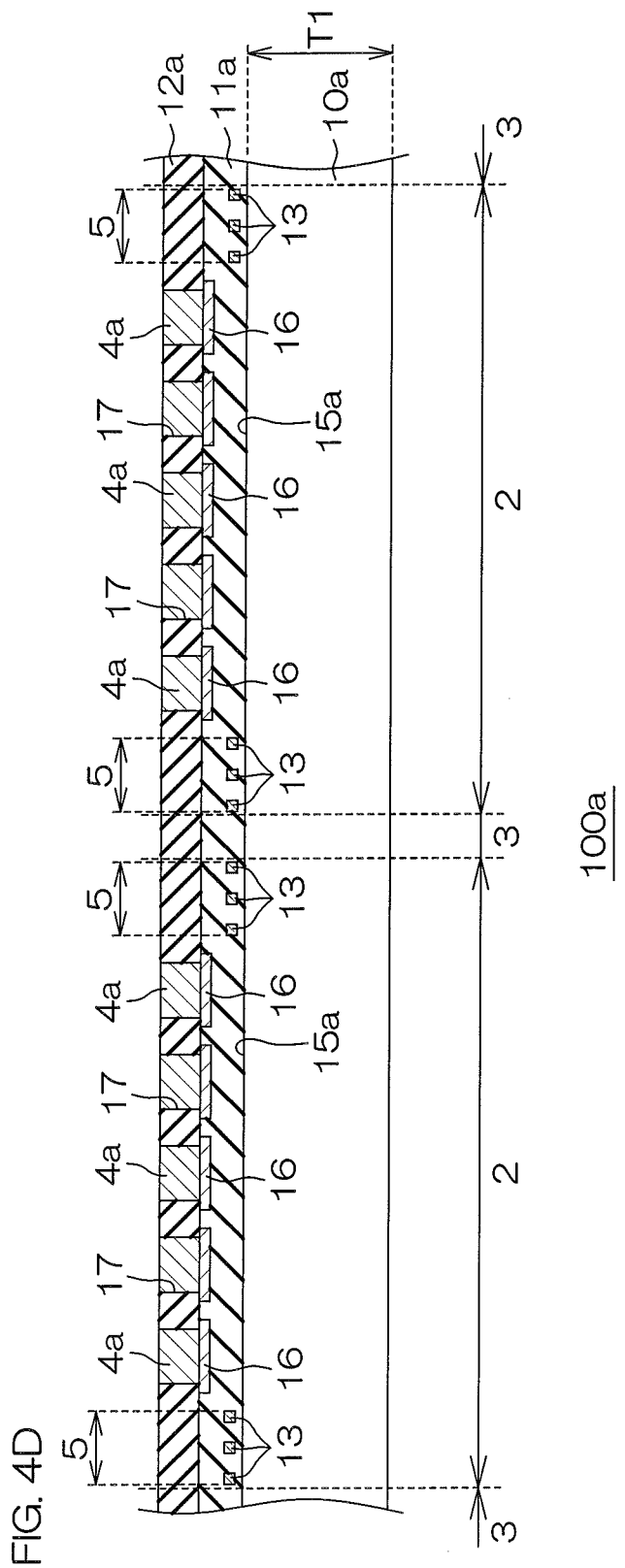
FIGS. 4A to 4O are sectional views for explaining an exemplary production process for the semiconductor device shown in FIG. 1.

Then, a seed film (not shown) is formed as an underlying electrode film over the through-holes 17 and the entire surface of the insulation layer 12a by a sputtering method. In turn, as shown in FIG. 4D, an electrically conductive material is deposited over the insulation layer 12a to fill the through-holes 17 by plating after the formation of the seed film. Then, unnecessary portions of the seed film and the electrically conductive material deposited on the insulation layer 12a by the plating are removed by a CMP (Chemical Mechanical Polishing) method. Thus, a plurality of bump electrodes 4a are formed as each having a surface flush with the surface of the insulation layer 12a, whereby the first semiconductor wafer 100a including a plurality of first semiconductor chips 20a is provided.

In turn, as shown in FIG. 4E, a second semiconductor substrate 10b is prepared for formation of second semiconductor chips 20b to be respectively connected to the first semiconductor chips 20a. Then, element formation regions 2, a scribing region 3 and first alignment formation regions 5 are defined on the second semiconductor substrate 10b as in the step of FIG. 4A. In turn, semiconductor elements and passive elements such as transistors, MOSFETs, resistors and capacitors are formed selectively in the element formation regions 2 of the second semiconductor substrate 10b. Thus, a surface of the second semiconductor substrate 10b formed selectively with the semiconductor elements, the passive elements and the like is defined as an active surface 15b.

Subsequently, as shown in FIG. 4F, a wiring layer 11b (multi-level wiring structure) is formed on the second semiconductor substrate 10b so as to be electrically connected to the semiconductor elements and the like formed in the active surface 15b. When the wiring layer 11b is formed, alignment metal portions 13 are simultaneously formed in the first alignment formation regions 5 so as to be electrically isolated from the active surface 15b. In this embodiment, routing wirings and the alignment metal portions 13 are simultaneously formed in the second sublayer of the wiring layer 11b. Then, top metal portions 16 (uppermost wirings) and alignment top metal portions are formed in the uppermost sublayer of the wiring layer 11b so as to be exposed in a surface of the wiring layer 11b. At this time, the top metal portions 16 are electrically connected to the active surface 15b, and the alignment top metal portions 14 are electrically isolated from the active surface 15b.

Then, as shown in FIG. 4G, an insulative material (e.g., a photosensitive polyimide) is deposited over the top metal portions 16 and the alignment top metal portions 14 to form an insulation layer 12b. In turn, the insulation layer 12b is exposed to light as having a pattern corresponding to through-holes 17 by photolithography. Then, the insulation layer 12b is heat-treated (cured). Thus, the insulation layer 12b has a thickness reduced by thermal contraction, and is hardened to have a stable film quality. Thus, the through-holes 17 are formed (developed).

Figure 4H:
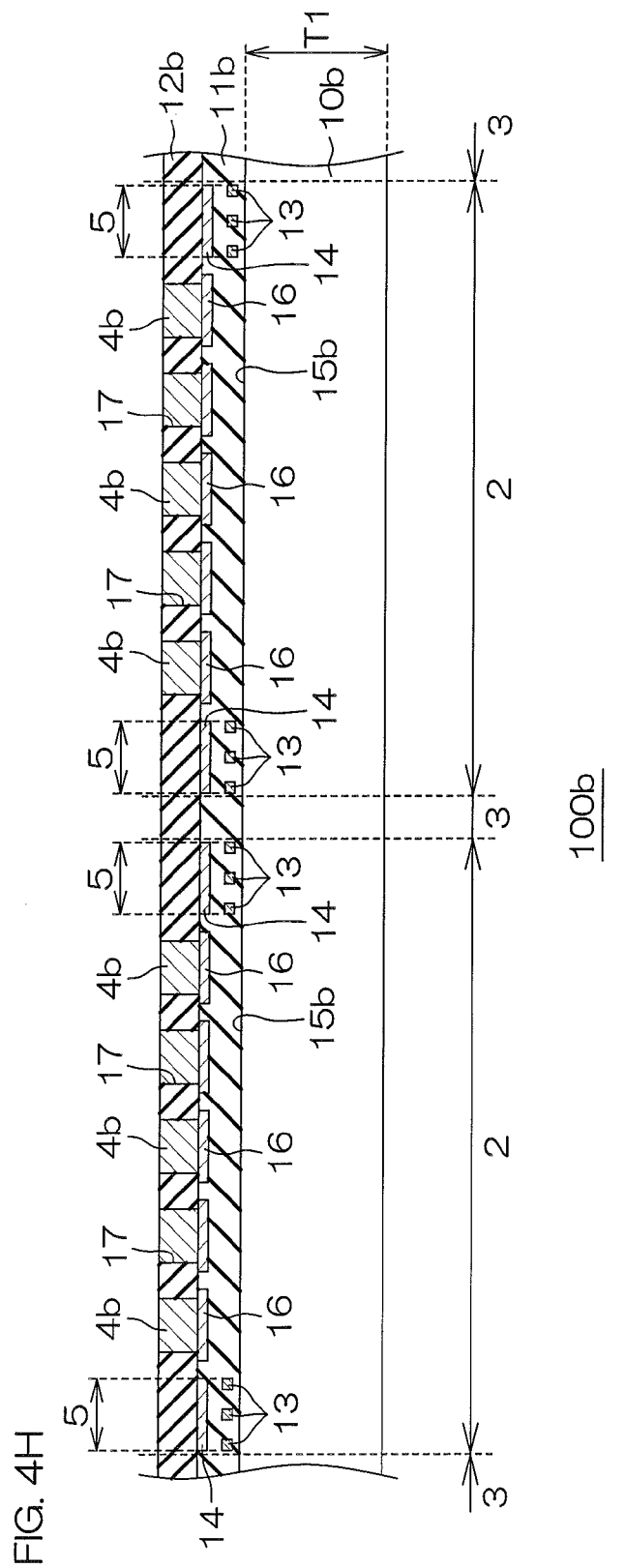
Figure 4:
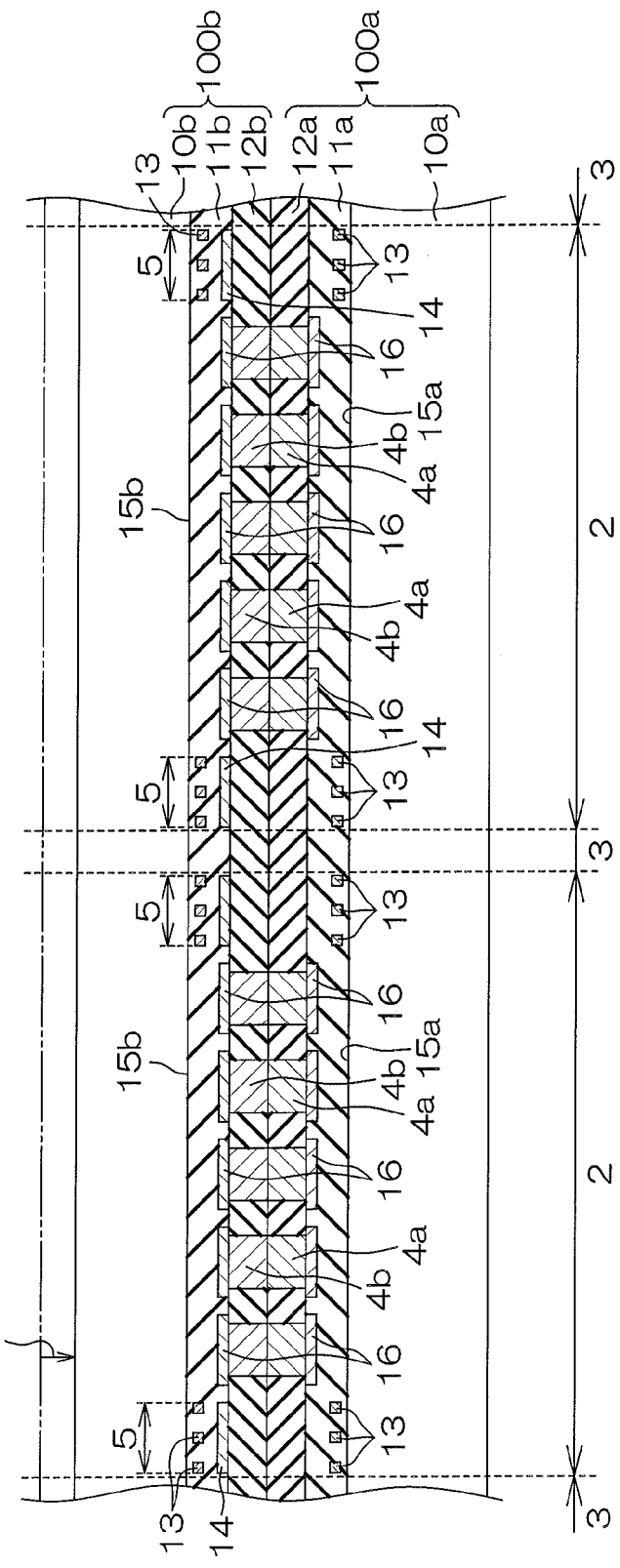

Then, a seed film (not shown) is formed as an underlying electrode film over the through-holes 17 and the entire surface of the insulation layer 12b by a sputtering method. In turn, as shown in FIG. 4H, an electrically conductive material is deposited over the insulation layer 12b to fill the through-holes 17 by plating after the formation of the seed film. Then, unnecessary portions of the seed film and the electrically conductive material deposited on the insulation layer 12b by the plating are removed by a CMP method. Thus, a plurality of bump electrodes 4b are formed as each having a surface flush with the surface of the insulation layer 12b, whereby the second semiconductor wafer 100b including a plurality of second semiconductor chips 20b is provided.

Subsequently, as shown in FIG. 4I, the second semiconductor wafer 100b is stacked on the first semiconductor wafer 100a. At this time, the second semiconductor wafer 100b is stacked on the first semiconductor wafer 100a, so that the active surface 15b is opposed to the active surface 15a of the first semiconductor chips 20a. More specifically, the first and second semiconductor wafers 100a, 100b are stacked one on another, so that the bump electrodes 4a and the insulation layer 12a are respectively connected to the bump electrodes 4b and the insulation layer 12b. At this time, juncture surfaces of the first and second semiconductor wafers 100a, 100b are plasma-cleaned, and then heat-bonded to each other at a predetermined bonding temperature. Even if a substrate (e.g., a Si substrate, a glass substrate or the like) formed with no circuit is employed as the first semiconductor wafer 100a, the stacking step is performed in the same manner.

Subsequently, a back surface of the second semiconductor substrate 10b (i.e., a surface opposite from the active surface 15b) is ground by means of a grindstone and then polished by a CMP method, whereby the thickness of the second semiconductor substrate 10b is reduced.

Then, as shown in FIG. 4J, a mask 22 having openings 22a selectively in regions to be formed with first via-electrodes 25 is formed on the back surface of the second semiconductor substrate 10b.

Figure 4K:
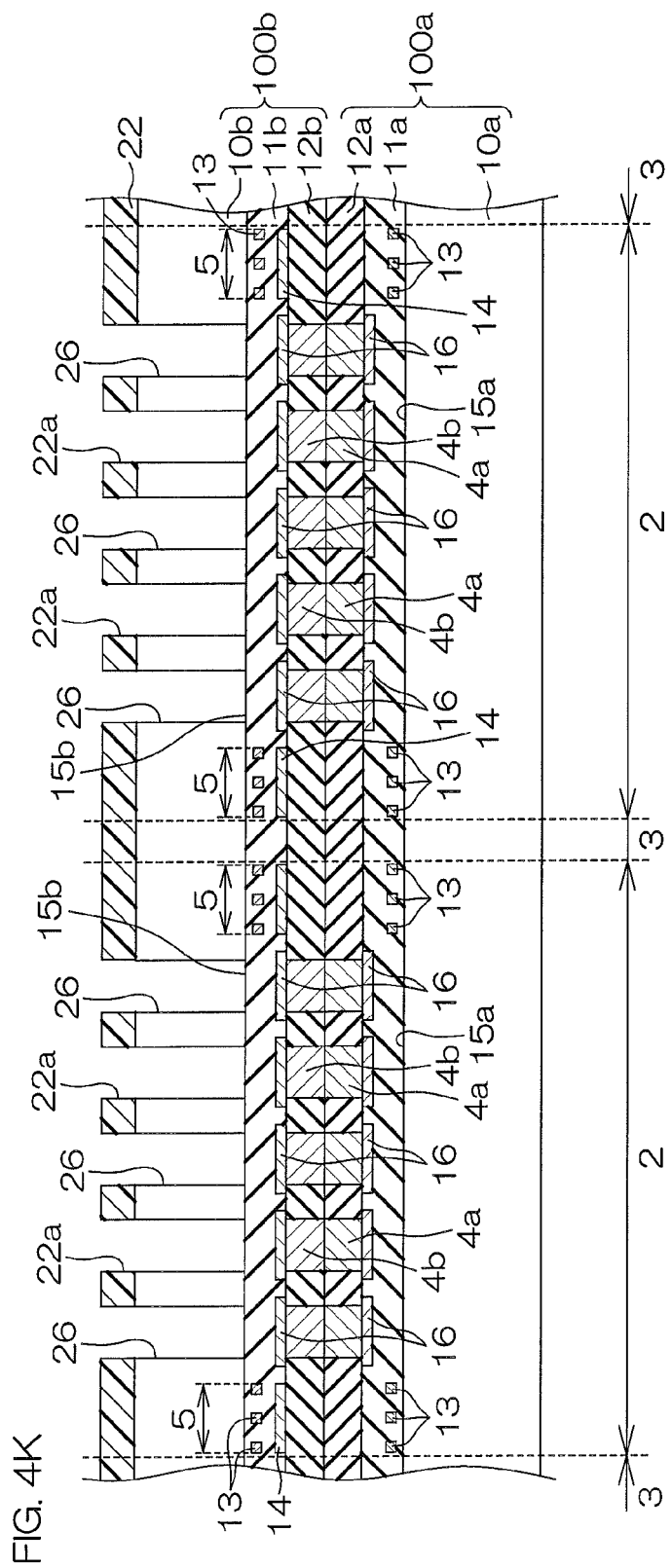

In turn, as shown in FIG. 4K, the back surface of the second semiconductor substrate 10b is etched with the use of the mask 22, whereby through-holes 26 are formed. After the formation of the through-holes 26, the mask 22 is removed.

Figure 4L:
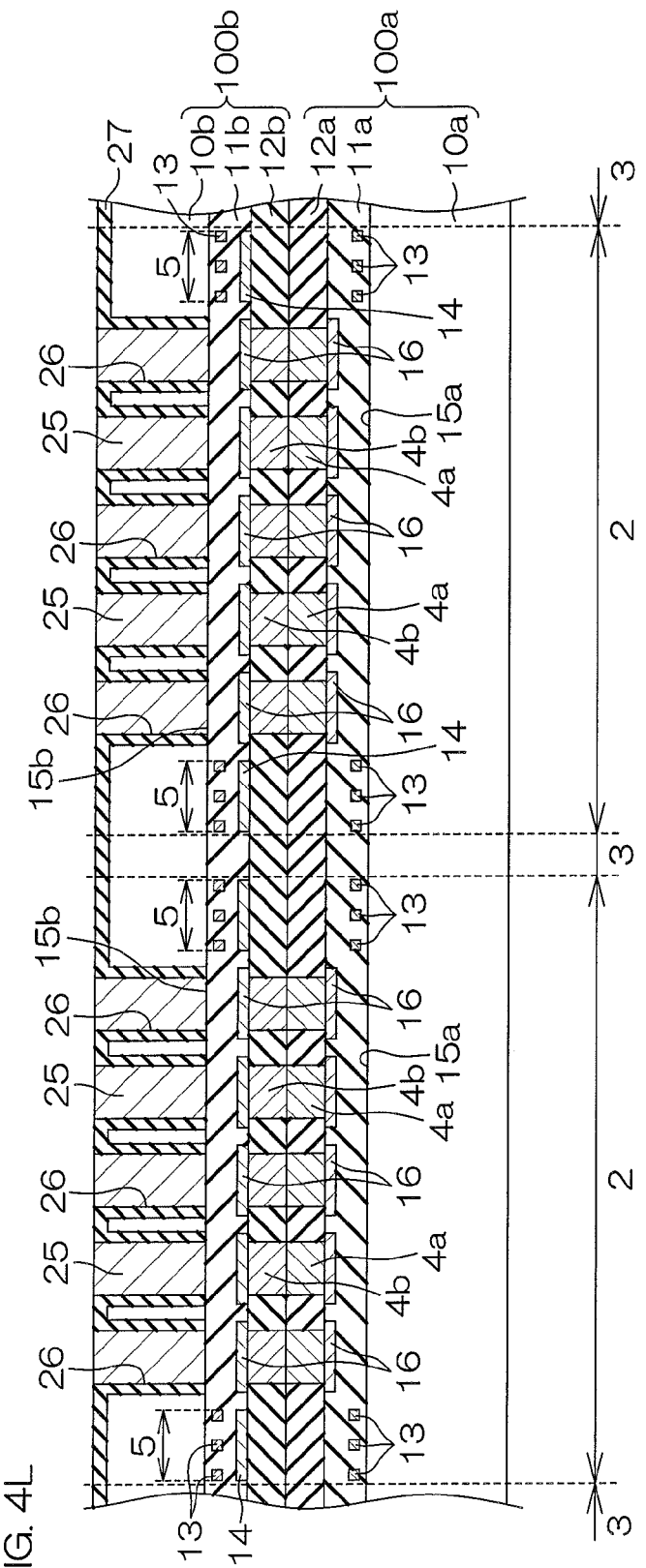

Subsequently, as shown in FIG. 4L, an insulation film 27 of a silicon oxide film is formed over the entire back surface of the second semiconductor substrate 10b including side surfaces of the through-holes 26 by a CVD method. Then, a seed film (not shown) is formed as an underlying electrode film over the entire surface of the insulation film 27 including the through-holes 26 by a sputtering method. In turn, an electrically conductive material is deposited over the insulation film 27 to fill the through-holes 26 by plating after the formation of the seed film. Then, unnecessary portions of the seed film and the electrically conductive material deposited on the insulation film 27 by the plating is removed. Thus, the first via-electrodes 25 are formed as each having a surface flush with the surface of the insulation film 27.

Figure 4M:
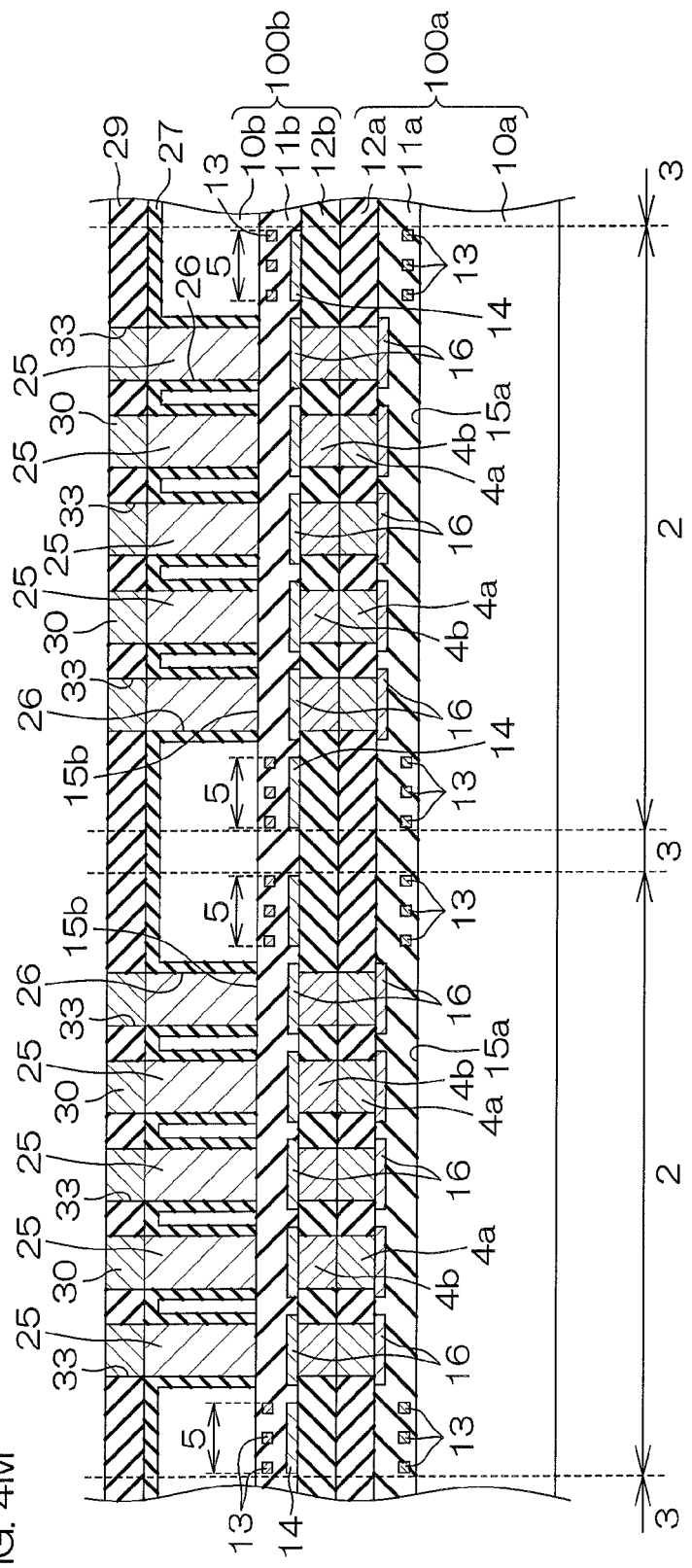
Figure 40:
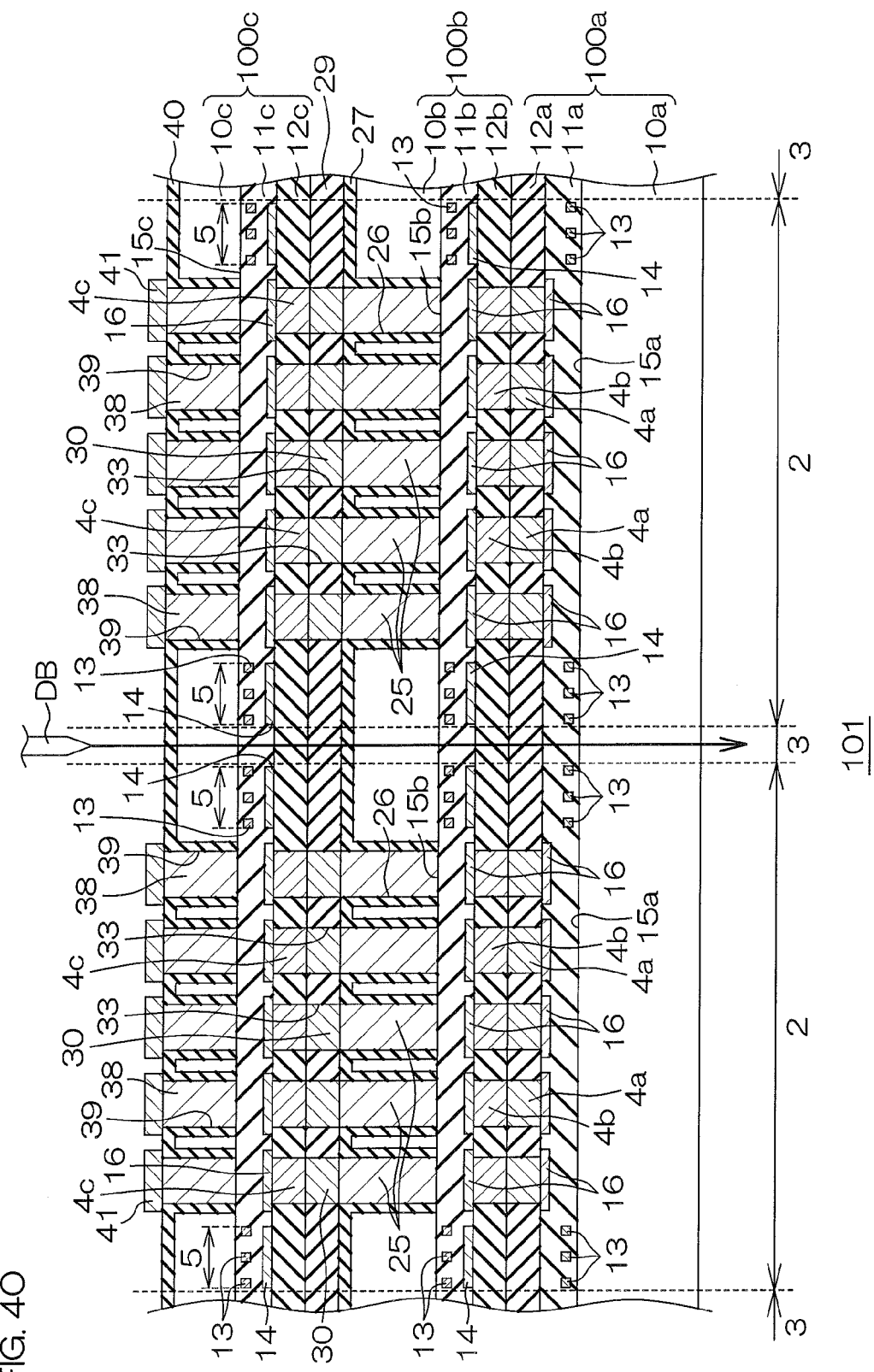

In turn, as shown in FIG. 4M, an insulative material (e.g., a photosensitive polyimide) is deposited over the back surface of the second semiconductor substrate 10b so as to cover the first via-electrodes 25, whereby a back side insulation layer 29 is formed. Then, the back side insulation layer 29 is exposed to light in a pattern corresponding to through-holes 33 by photolithography. Then, the back side insulation layer 29 is heat-treated (cured). Thus, the back side insulation layer 29 has a thickness reduced by thermal contraction, and is hardened to have a stable film quality. Thus, the through-holes 33 are formed (developed).

Subsequently, a seed film (not shown) is formed as an underlying electrode film over the through-holes 33 and the entire surface of the back side insulation layer 29 by a sputtering method. In turn, an electrically conductive material is deposited over the back side insulation layer 29 by plating to fill the through-holes 33 after the formation of the seed film. Then, unnecessary portions of the seed film and the electrically conductive material deposited on the back side insulation layer 29 by the plating are removed by a CMP method. Thus, the back side bump electrodes 30 are formed as each having a surface flush with the surface of the back side insulation layer 29.

Then, as shown in FIG. 4N, a third semiconductor wafer 100c prepared in substantially the same manner as in the steps of FIGS. 4E to 4H is stacked on the back surface of the second semiconductor wafer 100b (second semiconductor substrate 10b). At this time, the third semiconductor wafer 100c is stacked on the second semiconductor wafer 100b, so that the active surface 15c of the third semiconductor wafer 100c is opposed to the back surface of the second semiconductor wafer 100b. More specifically, the second and third semiconductor wafers 100b, 100c are stacked one on another, so that the bump electrodes 4c and the insulation layer 12c are respectively connected to the back side bump electrodes 30 and the back side insulation layer 29. At this time, juncture surfaces of the second and third semiconductor wafers 100b, 100c are plasma-cleaned, and then heat-bonded to each other at a predetermined bonding temperature.

Subsequently, a back surface (i.e., a surface opposite from the active surface 15c) of the third semiconductor substrate 10c is ground by means of a grindstone and then polished by a CMP method, whereby the thickness of the third semiconductor substrate 10c is reduced.

Then, as shown in FIG. 4O, second via-electrodes 38 are formed as extending from the back surface of the third semiconductor substrate 10c. For the formation of the second via-electrodes 38, a mask (not shown) having openings selectively in regions to be formed with the second via-electrodes 38 is formed on the back surface of the third semiconductor substrate 10c in substantially the same manner as in the step of FIG. 4J. In turn, the back surface of the third semiconductor substrate 10c is etched with the use of the mask, whereby through-holes 39 are formed. After the formation of the through-holes 39, the mask is removed.

Subsequently, an insulation film 40 of a silicon oxide film is formed over the entire back surface of the third semiconductor substrate 10c including side surfaces of the through-holes 39 by a CVD method. Then, a seed film (not shown) is formed as an underlying electrode film over the entire surface of the insulation film 40 including the through-holes 39 by a sputtering method. In turn, an electrically conductive material is deposited over the insulation film 40 to fill the through-holes 39 by plating after the formation of the seed film. Then, unnecessary portions of the seed film and the electrically conductive material deposited on the insulation film 40 by the plating are removed by a CMP method. Thus, the second via-electrodes 38 are formed as each having a surface flush with the surface of the insulation film 40.

In turn, an electrically conductive material is deposited selectively on the second via-electrodes 38 by plating, whereby front side bump electrodes 41 are formed. In this manner, a wafer structure 101 (see FIG. 3) is provided, which includes the first to third semiconductor wafers 100a, 100b, 100c stacked one on another.

Subsequently, the wafer structure 101 is cut along the scribing region 3 by means of a dicing blade DB. Thus, semiconductor devices 1 are produced, which each have a structure such that the first to third semiconductor chips 20a, 20b, 20c are stacked one on another as shown in FIGS. 1 to 2B.

Referring to FIGS. 5 and 6, the mask positioning step of FIG. 4J will be described more specifically. FIGS. 5 and 6 are diagrams for explaining the step of FIG. 4J.

In the step of FIG. 4J, the alignment marks AM1 (the alignment metal portions 13 and the alignment top metal portions 14) are detected as shown in FIG. 5 before the mask 22 is positioned. For the detection of the alignment marks AM1, infrared radiation IR is applied to the back surface of the second semiconductor wafer 100 (the back surface of the second semiconductor substrate 10b) from an infrared microscope (exposure machine) not shown.

Light rays C incident on a region other than the first alignment formation regions 5 are reflected on none of the alignment top metal portions 14 and the alignment metal portions 13, but pass through the second semiconductor wafer 100b and/or the first semiconductor wafer 100a as it is. Therefore, the light rays C are not detected by the infrared microscope and, if being detected, contains a great amount of unnecessary information.

On the other hand, light rays incident on the first alignment formation regions 5 include light rays A1 incident on the alignment top metal portions 14 and light rays B1 incident on the alignment metal portions 13. The incident light rays A1, B1 are reflected on the alignment top metal portions 14 and the alignment metal portions 13. The light rays A2 reflected on the alignment top metal portions 14 and the light rays B2 reflected on the alignment metal portions 13 travel along a light path extending from reflective surfaces of the alignment metal portions 13 and the alignment top metal portions 14 to the infrared microscope through the second semiconductor substrate 10b, and then detected by the infrared microscope.

Just above the alignment metal portions 13, no electrically conductive material portion is provided, but only the wiring layer 11b and the second semiconductor substrate 10b are present. Therefore, the reflected light rays B2 are not interrupted by the other electrically conductive material portions in the light path. In addition, the alignment top metal portions 14 are located just below the alignment metal portions 13 to cover the alignment metal portions 13. Therefore, the infrared radiation IR is effectively prevented from reaching a level lower than the alignment top metal portions 14 to be reflected. This makes it easy to provide contrast between the regions formed with the alignment top metal portions 14 and the alignment metal portions 13 and the region not formed with these metal portions 14, 13. As a result, the light rays A2, B2 reflected on the alignment top metal portions 14 and the alignment metal portions 13 (i.e., the alignment marks AM1) can be properly detected. In this embodiment, other electrically conductive film may be provided at a level lower than the alignment top metal portions 14 (e.g., in the insulation layer 12a, 12b, the wiring layer 11a or the like).

As shown in FIG. 6, the mask 22 has marks 23 corresponding to the alignment marks AM1 in addition to the openings 22a. In the mask positioning step of FIG. 4J, the position of the mask 22 with respect to the back surface of the second semiconductor substrate 10b is determined, and the mask 22 is positioned based on the alignment marks AM1 detected in the step of FIG. 5 and the marks 23 provided in the mask 22. In this embodiment, the marks provided (printed) in the mask 22 as corresponding to the alignment marks AM1 each have the same shape as the alignment marks AM1.

The production method for the semiconductor device 1 employs a Via-Last (Back-Via) method in which the first via-electrodes 25 are formed after the second semiconductor substrate 10b is stacked on the first semiconductor substrate 10a. The mask 22 for the formation of the first via-electrodes 25 is positioned based on the alignment marks AM1 properly detected by the infrared microscope, and the marks 23 provided in the mask 22. As a result, the mask 22 can be accurately positioned on the back surface of the second semiconductor substrate 10b. Therefore, the first vie-electrodes 25 can be formed at proper positions in the second semiconductor substrate 10b in the steps of FIGS. 4K to 4L.

In the production method for the semiconductor device 1 according to the first embodiment, as described above, the light rays A2, B2 reflected on the alignment top metal portions 14 and the alignment metal portions 13 (i.e., the alignment marks AM1) can be advantageously detected by the infrared microscope. As a result, the mask 22 for the formation of the first via-electrodes 25 can be accurately positioned on the back surface of the second semiconductor substrate 10b in the step of FIG. 4J. Therefore, the first via-electrodes 25 can be formed at accurate positions in the steps of FIGS. 4K to 4L.

Substantially the same step as the step shown in FIGS. 5 and 6 is applicable to the step of forming the second via-electrodes 38 in the third semiconductor substrate 10c. As a result, the second via-electrodes 38 can be formed at accurate positions in the step of FIG. 4O.

In the steps of FIGS. 4B and 4F, the alignment metal portions 13 can be formed together with the wiring layers 11a, 11b or 11c. The alignment top metal portions 14 and the top metal portions 16 can be formed in the same step. Therefore, the production process can be simplified.

FIG. 7 is a sectional view showing a first alignment formation region 5 of a semiconductor device 42 according to a second embodiment of the present invention. The semiconductor device 42 according to the second embodiment differs from the semiconductor device 1 according to the first embodiment in that a plurality of alignment metal portions 44 are provided instead of the alignment metal portions 13. The other arrangement is the same as that of the semiconductor device 1 according to the first embodiment. In FIG. 7, components corresponding to those shown in FIGS. 1 to 6 are designated by the same reference characters as in FIGS. 1 to 6, and duplicate description will be omitted.

The alignment metal portions 44 are provided selectively in different sublayers of the wiring layer 11b. In other words, the alignment metal portions 44 are provided selectively in a region between the front surface of the second semiconductor substrate 10b and the alignment top metal portion 14. The alignment metal portions 44 have the same overall shape as the alignment top metal portion 14 as seen in plan in FIG. 1.

In this embodiment, more specifically, the wiring layer 11b includes a first wiring sublayer 111 having a first pattern and a second wiring sublayer 112 having a second pattern. The first and second wiring sublayers 111, 112 are alternately periodically stacked one on another plural times.

The first pattern of the first wiring sublayer 111 is configured such that alignment metal portions 44 each having a quadrilateral plan shape and blank areas 45 each having a quadrilateral plan shape and not formed with the alignment metal portions 44 are alternately arranged. On the other hand, the second pattern of the second wiring sublayer 112 includes alignment metal portions 44 associated with the blank areas 45 of the first pattern, and blank areas associated with the alignment metal portions 44 of the first pattern. The first and second wiring sublayers 111, 112 are periodically alternately stacked one on another plural times, whereby the alignment metal portions 44 of the first and second patterns are combined together to have the same overall shape as the alignment top metal portion 14 as seen in plan.

In this embodiment, the first wiring sublayer 111 and the second wiring sublayer 112 are periodically alternately stacked one on another plural times by way of example. Alternatively, the wiring layer 11b may be configured such that the first wiring sublayers 111 are sequentially stacked one on another and the second wiring sublayers 112 are sequentially stacked one on another.

Even where the alignment metal portions 44 are provided in each of the sublayers (the first wiring sublayers 111 and the second wiring sublayers 112) of the wiring layer 11b, it is possible to provide the same effects as described in the first embodiment. In this embodiment, the plurality of alignment metal portions 44 are provided in each of the sublayers of the wiring layer 11b, so that more intensive reflected light B2 (see FIGS. 5 and 6) can be detected by the infrared microscope.

Of course, the arrangement of the plural alignment metal portions 44 may be applied to the wiring layer 11c of the third semiconductor chip 20c.

FIG. 8 is a sectional view showing a first alignment formation region 5 of a semiconductor device 51 according to a third embodiment of the present invention.

The semiconductor device 51 according to the third embodiment differs from the semiconductor device 1 according to the first embodiment in that alignment bumps 114 are provided instead of the alignment top metal portions 14. The other arrangement is the same as that of the semiconductor device 1 according to the first embodiment. In FIG. 8, components corresponding to those shown in FIGS. 1 to 7 are designated by the same reference characters as in FIGS. 1 to 7, and duplicate description will be omitted.

As shown in FIG. 8, the alignment bumps 114 are each provided in the insulation layer 12b as covering the alignment metal portions 13. The alignment bump 114 has a quadrilateral plan shape, for example, as seen in a direction normal to the semiconductor device 51.

The alignment bump 114 is composed of an electrically conductive material, and buried in a through-hole 117. The through-hole 117 extends thicknesswise through the insulation layer 12b. The electrically conductive material for the alignment bump 114 is deposited in the through-hole 117 so as to be flush with the surface of the insulation layer 12b. The alignment bump 114 is electrically isolated from the first and second semiconductor chips 20a, 20b. The alignment bump 114 is made of the same electrically conductive material as the bump electrodes 4b of the second semiconductor chip 20b.

As described above, the semiconductor device of the third embodiment provides the same effects as described in the first embodiment.

The formation of the alignment bumps 114 can be achieved by modifying the steps of FIGS. 4F and 4G in the first embodiment. That is, the layout of the mask (not shown) for the formation of the top metal portions 16 is modified so as not to form the alignment top metal portions 14 in the step of FIG. 4F, and the insulation layer 12b is further exposed to light in a pattern corresponding to regions to be formed with the through-holes 117 in FIG. 4G. Thus, the through-holes 117 are formed. Thereafter, in the step of FIG. 4G, a seed film is formed as an underlying electrode film in the through-holes 117, and the electrically conductive material is deposited in the through-holes 117 by plating. Thus, the alignment bumps 114 can be formed. In this production method, the bump electrodes 4 and the alignment bumps 114 can be formed in the same step, so that the production process can be simplified.

Figure 9:
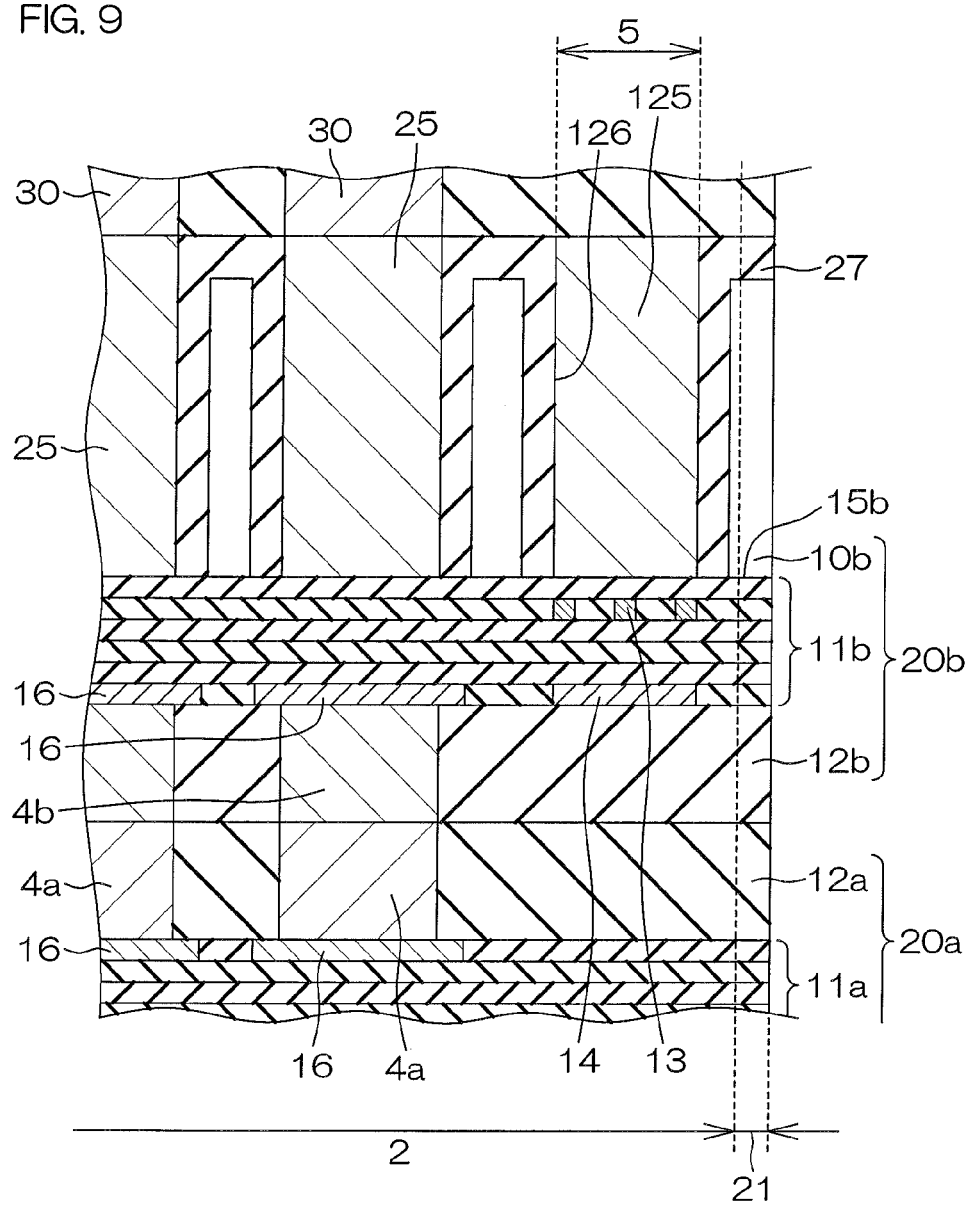
FIG. 9 is a sectional view showing a first alignment formation region of a semiconductor device according to a fourth embodiment of the present invention.

FIG. 9 is a sectional view showing a first alignment formation region 5 of a semiconductor device 61 according to a fourth embodiment of the present invention.

The semiconductor device 61 according to the fourth embodiment differs from the semiconductor device 1 according to the first embodiment in that an alignment via 125 is further provided in the second semiconductor substrate 10b in each of the first alignment formation regions 5. The other arrangement is the same as that of the semiconductor device 1 according to the first embodiment. In FIG. 9, components corresponding to those shown in FIGS. 1 to 8 are designated by the same reference characters as in FIGS. 1 to 8, and duplicate description will be omitted.

As shown in FIG. 9, the alignment via 125 is provided in the second semiconductor substrate 10b as covering the alignment metal portions 13 and the alignment top metal portion 14. The alignment via 125 has the same plan shape as the alignment top metal portion 14 (i.e., quadrilateral plan shape), for example, as seen in a direction normal to the semiconductor device 61.

The alignment via 125 is composed of an electrically conductive material, and buried in alignment through-hole 126. The alignment through-hole 126 extends thicknesswise through the semiconductor substrate 10b with a bottom thereof located on the wiring layer 11b of the semiconductor chip 20b. In this embodiment, the insulation film 27 is further provided on side surfaces of the alignment through-holes 126. The alignment via 125 of the electrically conductive material is buried in the alignment through-hole 126 with the intervention of a portion of the insulation film 27 provided on the side surface of the alignment through-hole 126. The alignment via 125 is made of the same electrically conductive material as the first via-electrodes 25.

As described above, the semiconductor device according to the fourth embodiment provides the same effects as described in the first embodiment.

For the formation of the alignment vias 125, a mask having openings selectively in regions to be formed with the first via-electrodes 25 and the alignment vias 125 is positioned instead of the mask 22 on the back surface of the second semiconductor substrate 10b in the step of FIG. 4J in the first embodiment. Although the marks 23 are provided in the mask 22 as corresponding to the alignment marks AM1 as shown in FIG. 6, openings for the formation of the alignment vias 125, for example, are formed in place of the marks 23. Thus, the alignment vias 125 can be formed simultaneously with the first via-electrodes 25. This production method makes it possible to form the first via-electrodes 25 and the alignment vias 125 in the same process step, so that the production process can be simplified.

The mask for the formation of the second via-electrodes 38 in the third semiconductor wafer 100c is positioned on the back surface of the third semiconductor wafer 100c in the same manner as in the step described with reference to FIGS. 5 and 6. Even if the light rays A1, B1 incident on the first alignment formation regions 5 (see FIGS. 5 and 6) pass through the alignment top metal portions 14 [of the third semiconductor wafer 100c] at this time, the light rays A1, B1 are reflected on the alignment vias 125 provided below the alignment top metal portions 14. Thus, the alignment marks AM1 can be more advantageously detected, so that the second via-electrodes 38 can be respectively formed at accurate positions.

Figure 10:
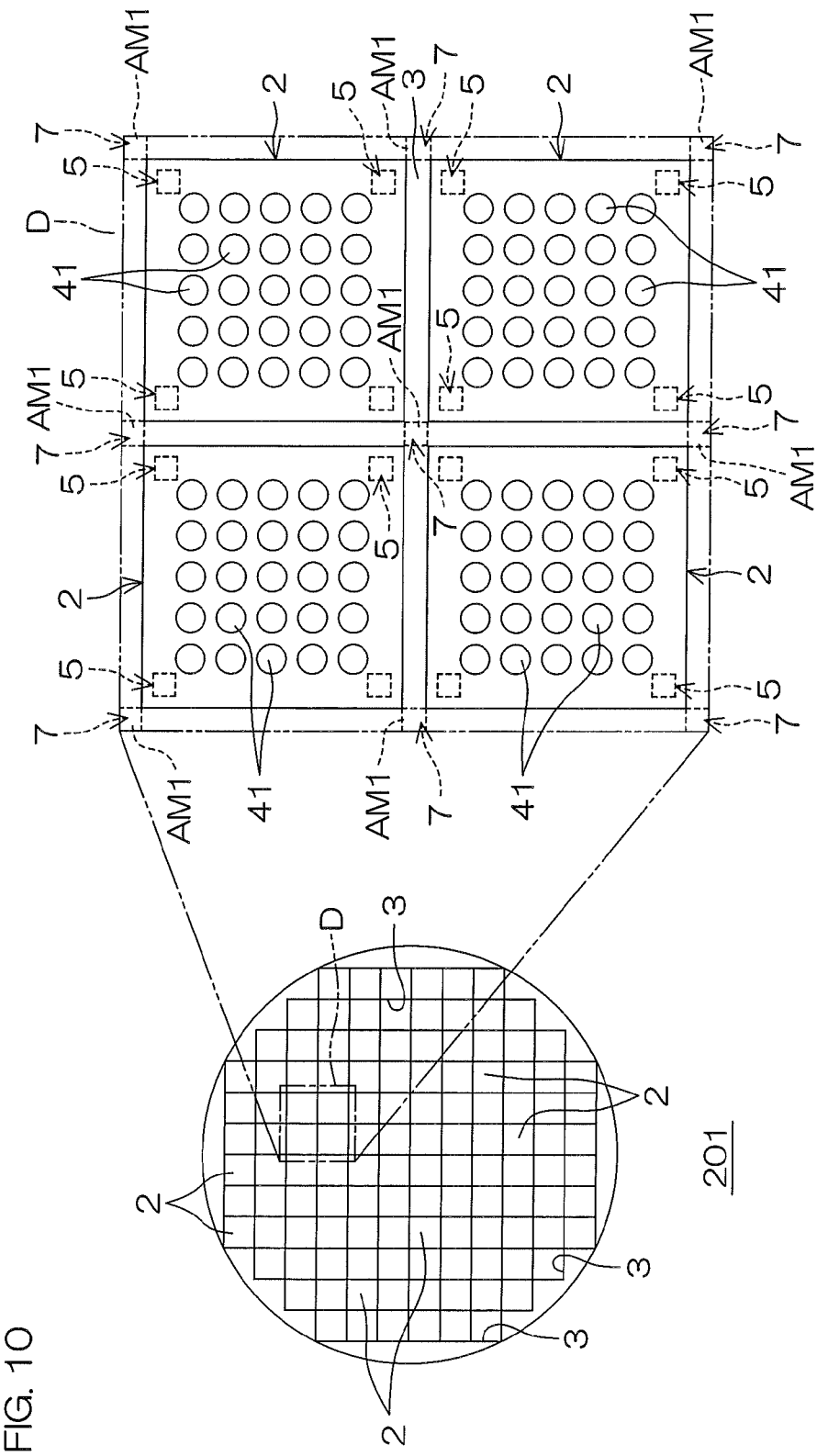
FIG. 10 is a schematic plan view showing a wafer structure according to a fifth embodiment of the present invention.

FIG. 10 is a schematic plan view showing a wafer structure 201 according to a fifth embodiment of the present invention.

The wafer structure 201 according to the fifth embodiment differs from the wafer structure 101 according to the first embodiment in that second alignment formation regions 7 are defined in the scribing region 3 in addition to the first alignment formation regions 5. The other arrangement is the same as that of the wafer structure 101 according to the first embodiment. In FIG. 10, components corresponding to those shown in FIGS. 1 to 9 are designated by the same reference characters as in FIGS. 1 to 9, and duplicate description will be omitted.

As shown in FIG. 10, the second alignment formation regions 7 are each defined in a region at which a portion of the scribing region 3 extending in a row direction intersects a portion of the scribing region 3 extending in a column direction. In each of the second alignment formation regions 7, alignment metal portions and an alignment top metal portion (not shown) are provided in the same arrangement as the alignment metal portions 13 and the alignment top metal portion 14.

In this embodiment, the second alignment formation regions 7 are each provided in the region at which the portion of the scribing region 3 extending in the row direction intersects the portion of the scribing region 3 extending in the column direction by way of example. However, the second alignment formation regions 7 may be disposed anywhere in the scribing region 3.

The second alignment formation regions 7 can be formed simultaneously with the first alignment formation regions 5 simply by changing the layout of the mask. Therefore, the number of the steps of the production process is not increased. Where the second alignment formation regions 7 are additionally provided, alignment marks AM1 provided in the second alignment formation regions 7 are detected in addition to the alignment marks AM1 provided in the first alignment formation region 5 in the step of FIGS. 5 and 6 and, therefore, the mask 22 can be more accurately positioned.

The alignment marks AM1 (each including alignment metal portions and an alignment top metal portion) provided in the second alignment formation regions 7 are removed when the wafer structure is diced by means of the dicing blade DB (see FIG. 4O). In this case, parts of the alignment metal portions or parts of the alignment top metal portions provided in the second alignment formation regions 7 may remain in the marginal regions 21 (see FIG. 1) of the individual semiconductor devices separated from each other.

Figure 11:
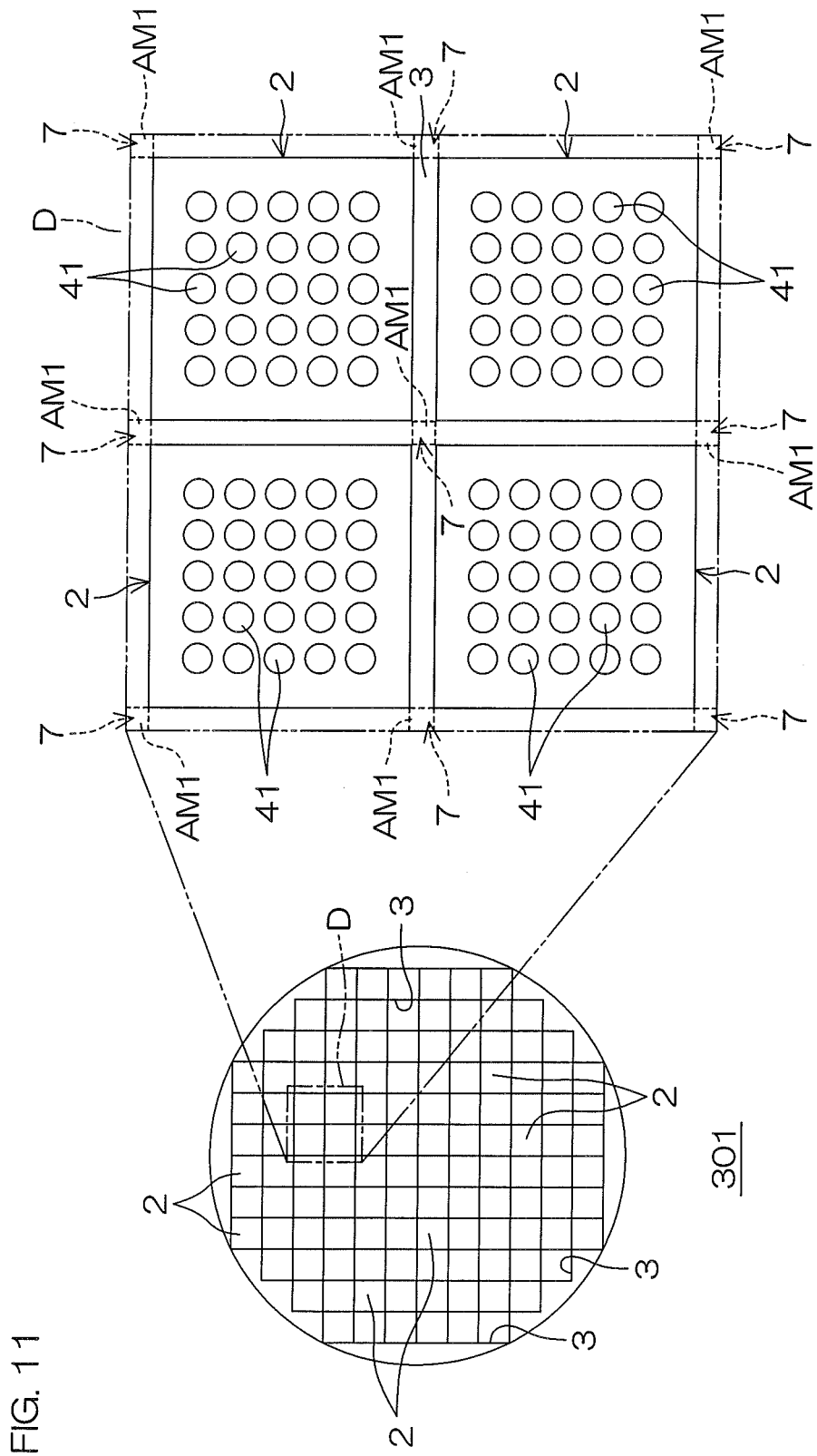
FIG. 11 is a schematic plan view showing a wafer structure according to a sixth embodiment of the present invention.

FIG. 11 is a schematic plan view showing a wafer structure 301 according to a sixth embodiment of the present invention.

The wafer structure 301 according to the sixth embodiment differs from the wafer structure 201 according to the fifth embodiment in that the first alignment formation regions 5 are not provided. The other arrangement is the same as that of the wafer structure 201 according to the fifth embodiment. In FIG. 11, components corresponding to those shown in FIGS. 1 to 10 are designated by the same reference characters as in FIGS. 1 to 10, and duplicate description will be omitted.

Formation of the second alignment formation regions 7 can be achieved by performing only the step of forming the second alignment formation regions 7 in the scribing region 3.

In this production method, the second alignment formation regions 7 are formed in the scribing region 3 and, therefore, are not influenced by the limitation of the design rule of the element formation regions 2. As a result, it is possible to accurately position the mask 22 on the back surface of the second semiconductor wafer 100b (third semiconductor wafer 100c) for the formation of the first via-electrodes 25 (second via-electrodes 38) while permitting more flexible design of the semiconductor device.

The alignment marks AM1 (each including alignment metal portions and an alignment top metal portion) respectively provided in the second alignment formation regions 7 are removed when the wafer structure is diced by means of the dicing blade DB (see the step of FIG. 4O). In this case, parts of the alignment metal portions or parts of the alignment top metal portions provided in the second alignment formation regions 7 may remain in the marginal regions 21 (see FIG. 1) of the individual semiconductor devices separated from each other.

Figure 12A:
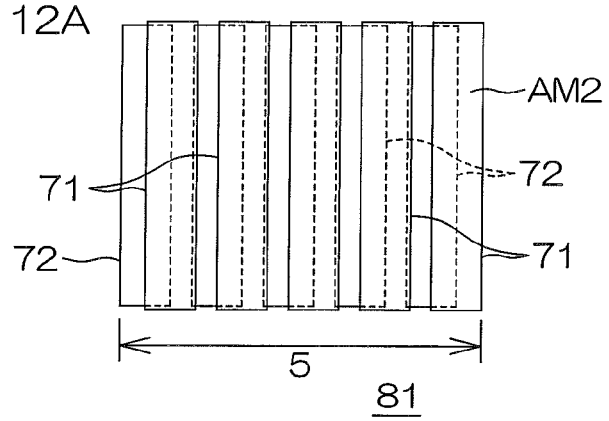
FIG. 12A is a plan view showing a first alignment formation region of a semiconductor device according to a seventh embodiment of the present invention.
Figure 12B:
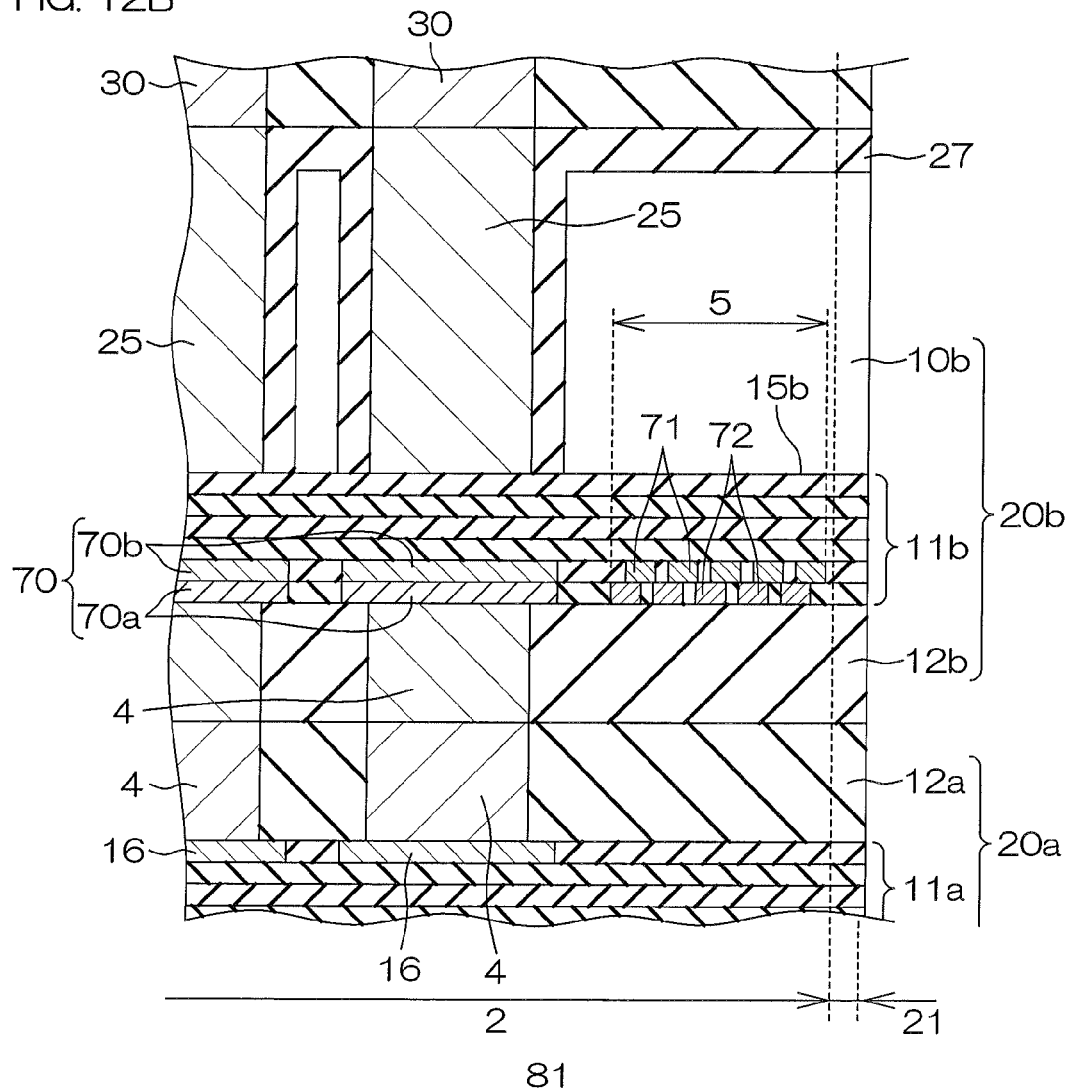
FIG. 12B is a sectional view for explaining the first alignment formation region shown in FIG. 12A.

FIG. 12A is a plan view showing a first alignment formation region 5 of a semiconductor device 81 according to a seventh embodiment of the present invention. FIG. 12B is a sectional view for explaining the first alignment formation region 5 shown in FIG. 12A.

The semiconductor device 81 according to the seventh embodiment differs from the semiconductor device 1 according to the first embodiment in that alignment metal portions 71 and alignment top metal portions 72 are provided instead of the alignment metal portions 13 and the alignment top metal portions 14, and in that top metal portions 70 each having a multi-layer structure are provided instead of the top metal portions 16. The other arrangement is the same as that of the semiconductor device 1 according to the first embodiment. In FIGS. 12A and 12B, components corresponding to those shown in FIGS. 1 to 11 are designated by the same reference characters as in FIGS. 1 to 11, and duplicate description will be omitted.

As shown in FIG. 12B, the top metal portions 70 each include a plurality of metal layers formed by depositing plural types of electrically conductive materials. In this embodiment, the top metal portions 70 each include two layers by way of example. In this embodiment, the top metal portions 70 each include an upper metal layer 70*a* and a lower metal layer 70*b*. The upper metal layer 70*a* and the lower metal layer 70*b* are respectively made of electrically conductive materials such as containing Cu or Al.

In each of the first alignment formation regions 5 according to this embodiment, as shown in FIG. 12A, a plurality of striped alignment metal portions 71 (indicated by solid lines) and a plurality of striped alignment top metal portions 72 (indicated by broken lines) as seen in plan are provided. As shown in FIG. 12B, the alignment top metal portions 72 and the upper metal layers 70*a* of the top metal portions 70 are provided at the same level, and the alignment metal portions 71 and the lower metal layers 70*b* of the top metal portions 70 are provided at the same level.

The alignment metal portions 71 are arranged in a line-and-space pattern having a line width and a pitch that are smaller than the resolution of the infrared microscope, and the alignment top metal portions 72 are arranged in a line-and-space pattern having a line width and a line pitch that are smaller than the resolution of the infrared microscope. More specifically, the alignment metal portions 71 are arranged in a striped pattern in spaced relation, and the alignment top metal portions 72 respectively cover areas defined between the alignment metal portions 71. The alignment metal portions 71 and the alignment top metal portions 72 are preferably arranged with their widthwise opposite edge portions overlapping one another.

The alignment metal portions 71 and the alignment top metal portions 72 collectively define a single alignment mark AM2 having a size not smaller than the resolution of the infrared microscope.

The alignment metal portions 71 and the alignment top metal portions 72 can be formed in the step of forming the top metal portions 70. The method in which the alignment marks AM2 are formed as each having a size not smaller than the resolution of the infrared microscope by forming the plurality of alignment metal portions 71 and the plurality of alignment top metal portions 72 is particularly effective for a case in which it is otherwise impossible to form the top metal portions 70 and the alignment marks AM2 in a size not smaller than the resolution of the infrared microscope.

If the alignment marks AM2 (each including the alignment metal portions 71 and the alignment top metal portions 72) each have a size smaller than the resolution of the infrared microscope, it is generally impossible to detect the alignment marks AM2 because of a detection limit in the step shown in FIGS. 5 and 6. In this embodiment, therefore, the alignment metal portions 71 and the alignment top metal portions 72 each having a size smaller than the resolution of the infrared microscope are provided in combination, so that the alignment marks AM2 can be properly detected.

While the embodiments of the present invention have thus been described, the present invention may be embodied in other ways.

In the embodiments described above, the alignment marks AM1, AM2 each have a quadrilateral shape as seen in plan by way of example. Alternatively, alignment marks AM3, AM4 each having a structure as shown in FIGS. 13A and 14A (FIGS. 13B and 14B) may be employed.

Figure 13A:
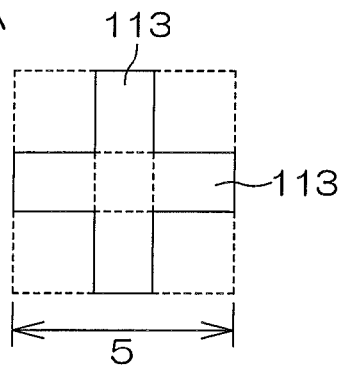
FIG. 13A is a plan view showing an alignment mark according to a first modification of the present invention.
Figure 13B:
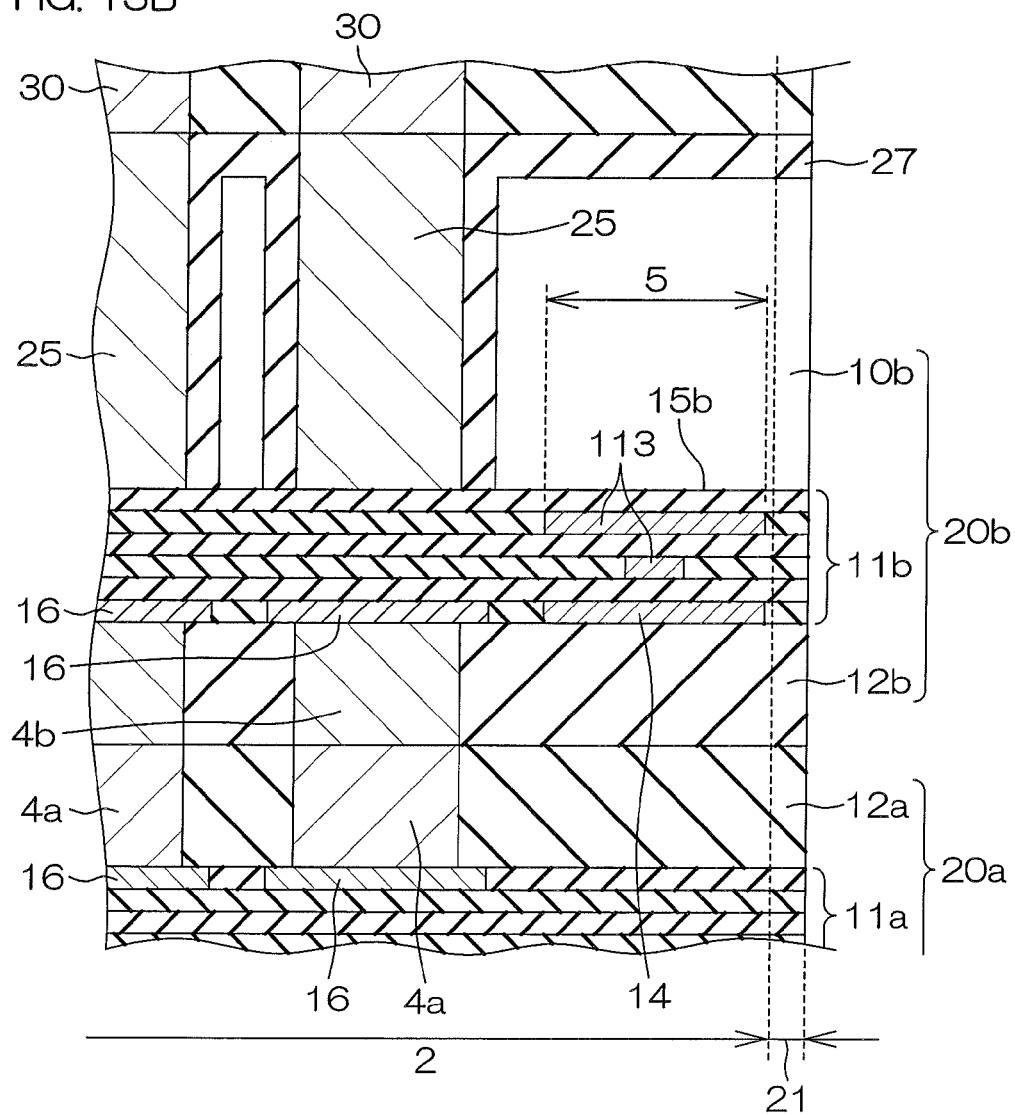
FIG. 13B is a sectional view for explaining the alignment mark shown in FIG. 13A.
Figure 14A:
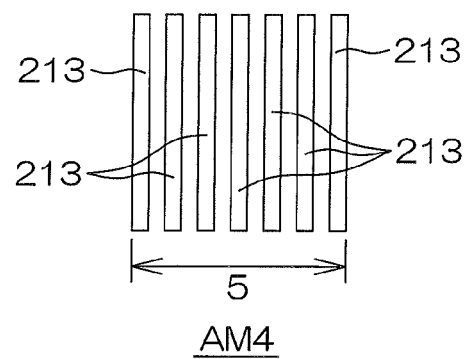
FIG. 14A is a plan view showing an alignment mark according to a second modification of the present invention.

FIG. 13A is a plan view showing the alignment mark AM3 according to a first modification of the present invention. FIG. 13B is a sectional view for explaining the alignment mark AM3 shown in FIG. 13A.

The first modification differs from the embodiments described above in that alignment marks AM3 each having a cross shape as seen in plan are provided instead of the alignment marks AM1, AM2 each having a quadrilateral plan shape. The other arrangement is the same as that of the semiconductor device 1 according to the first embodiment. In FIGS. 13A and 13B, components corresponding to those shown in FIGS. 1 to 12B are designated by the same reference characters as in FIGS. 1 to 12B, and duplicate description will be omitted.

According to the first modification, as shown in FIG. 13A, the alignment marks AM3 each having a cross shape as seen in plan are respectively provided in the first alignment formation regions 5. In each of the first alignment formation regions 5, as shown in FIG. 13B, two rectangular alignment metal portions 113 are disposed at different levels in spaced relation, and orthogonally cross each other at their gravity center [as seen in plan].

In the wafer structures 101, 201, 301, the cross-shaped alignment mark AM3 may be provided in each of the first alignment formation regions 5 (second alignment formation regions 7). In the wafer structures 101, 201, 301, the alignment mark AM1 having a quadrilateral plan shape described in the above embodiments may be provided in combination with the cross-shaped alignment mark AM3 in each of the first alignment formation regions 5 (second alignment formation regions 7).

In this modification, the two alignment metal portions 113 cooperatively define the single cross-shaped alignment mark AM3 by way of example. Alternatively, a plurality of alignment metal portions provided at different levels may cooperatively define the single cross-shaped alignment mark AM3.

Figure 14B:
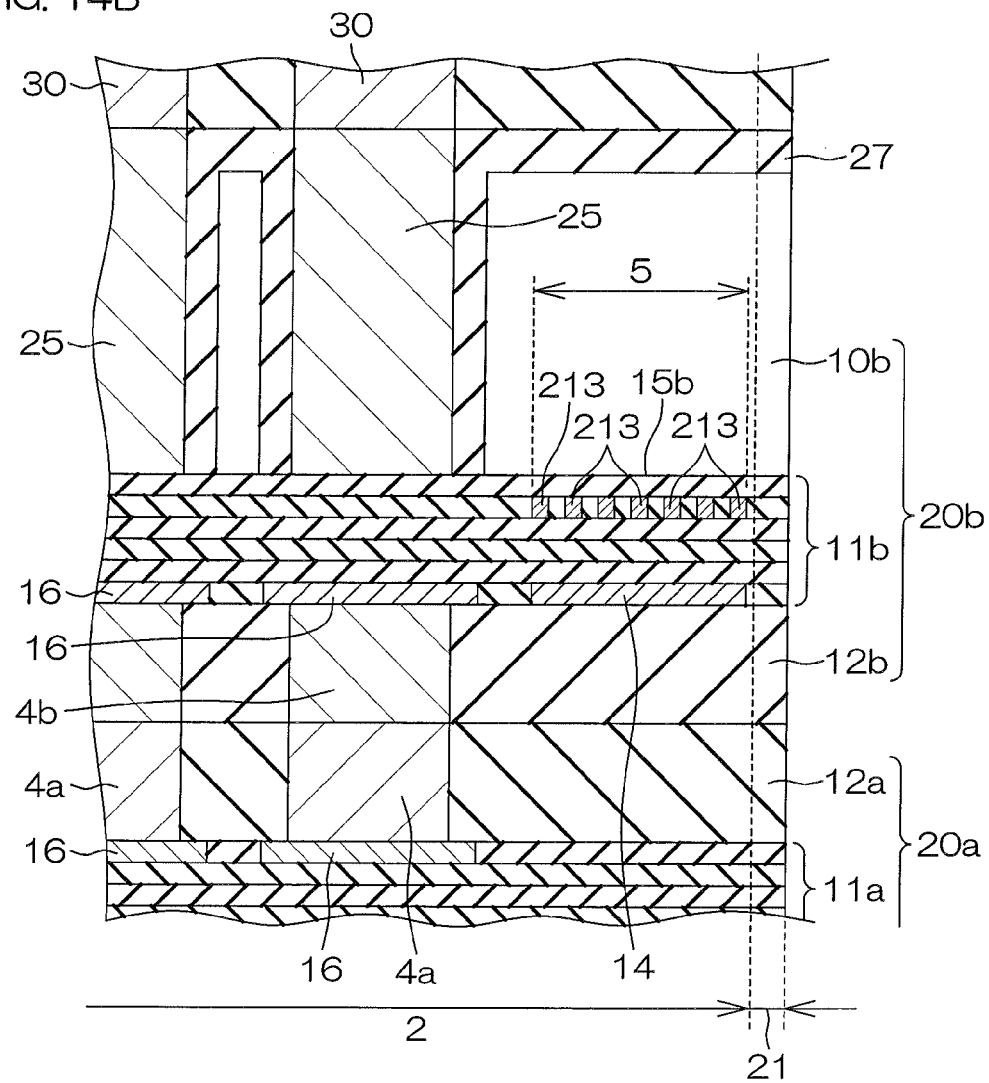
FIG. 14B is a sectional view for explaining the alignment mark shown in FIG. 14A.

FIG. 14A is a plan view showing the alignment mark AM4 according to a second modification of the present invention. FIG. 14B is a sectional view for explaining the alignment mark AM4 shown in FIG. 14A.

The alignment mark AM4 according to the second modification differs from the alignment mark AM1 according to the first embodiment in that the alignment mark AM4 includes a plurality of alignment metal portions 213 each having a size smaller than the resolution of the infrared microscope instead of the alignment metal portions 13.

According to the second modification, the alignment metal portions 213 are arranged in a line-and-space pattern having a predetermined line width and a predetermined line pitch such as to define the single alignment mark AM4 having a size not smaller than the resolution of the infrared microscope when the alignment mark is detected by the infrared microscope.

Formation of the alignment metal portions 213 can be achieved by changing the layout of the mask for the formation of the alignment metal portions 13 in the steps of FIGS. 4B and 4F. The method in which the alignment marks AM4 are formed as each having a size not smaller than the resolution of the infrared microscope by forming the plurality of alignment metal portions 213 is particularly effective for a case in which it is otherwise impossible to form the alignment marks in a size not smaller than the resolution of the infrared microscope.

In the third embodiment, the alignment bumps 114 are provided by way of example, but the alignment top metal portions 14 described in the first embodiment may be additionally provided. In this case, the light rays A2 can be intensified in the step shown in FIGS. 5 and 6. Further, the alignment top metal portions 14 as well as the alignment bumps 114 prevent the incident light rays A1 from traveling into lower layers. Therefore, the alignment marks AM1 can be more advantageously formed. Of course, this arrangement may be applied to the third semiconductor chip 20c (third semiconductor wafer 100c).

It should be understood that various design modifications may be made within the scope of the present invention defined by the following claims.

The invention claimed is:

1. A semiconductor device comprising:
a combination object; and
a chip having a front surface opposed to a front surface of the combination object;
wherein the chip includes:
a multi-level wiring structure provided in the front surface of the chip;
a connection electrode provided in the multi-level wiring structure and electrically connected to the combination object;
an alignment mark set provided in the multi-level wiring structure and electrically isolated from the connection electrode; and
an electrically conductive film provided at a higher level than the alignment mark set in association with the multi-level wiring structure to cover the alignment mark set and electrically isolated from the connection electrode.

2. The semiconductor device according to claim 1, wherein the chip further includes a through-electrode provided in the semiconductor substrate.

3. The semiconductor device according to claim 1, wherein the electrically conductive film is provided at the same level as the connection electrode.

4. The semiconductor device according to claim 1, wherein the connection electrode is electrically connected to the combination object via a bump provided on the multi-level wiring structure.

5. The semiconductor device according to claim 4, wherein the electrically conductive film is provided at the same level as the bump.

6. The semiconductor device according to claim 1,
wherein the alignment mark set is a set of alignment mark portions provided in the multi-level wiring structure,
wherein the alignment mark set is configured such that, when the semiconductor chip is seen in plan in a direction normal to the front surface thereof, the alignment mark portions are combined together into a size not smaller than a resolution of an exposure machine.

7. The semiconductor device according to claim 6, wherein the alignment mark set has the same shape as the electrically conductive film as seen in plan.

\* \* \* \* \*